(12) United States Patent
Lee et al.

(10) Patent No.: US 8,486,737 B2
(45) Date of Patent: Jul. 16, 2013

(54) THIN FILM DEPOSITION APPARATUS AND METHOD OF MANUFACTURING ORGANIC LIGHT-EMITTING DISPLAY DEVICE BY USING THE SAME

(75) Inventors: Yun-Mi Lee, Yongin (KR); Yong-Sup Choi, Yongin (KR); Hyun-Sook Park, Yongin (KR); Jong-Heon Kim, Yongin (KR); Jae-Kwang Ryu, Yongin (KR); Young-Mook Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 142 days.

(21) Appl. No.: 12/856,942

(22) Filed: Aug. 16, 2010

(65) Prior Publication Data

US 2011/0053296 A1    Mar. 3, 2011

(30) Foreign Application Priority Data

Aug. 25, 2009  (KR) .................. 10-2009-0078837
Feb. 16, 2010  (KR) .................. 10-2010-0013847

(51) Int. Cl.
| | | |
|---|---|---|
| H01L 21/00 | (2006.01) | |
| H01L 21/31 | (2006.01) | |
| H01L 21/469 | (2006.01) | |
| B05B 15/02 | (2006.01) | |
| B05B 15/04 | (2006.01) | |
| C23C 16/00 | (2006.01) | |

(52) U.S. Cl.
USPC ............. 438/29; 438/780; 438/795; 118/301; 118/302; 118/504; 118/720; 257/E21.169

(58) Field of Classification Search
USPC ..... 438/29, 780, 795; 257/E21.169; 118/720, 118/504, 302
See application file for complete search history.

(56) References Cited

U.S. PATENT DOCUMENTS

| | | | | |
|---|---|---|---|---|
| 5,460,654 | A * | 10/1995 | Kikkawa et al. | ............... 118/726 |
| 6,274,198 | B1 | 8/2001 | Dautartas | |
| 6,371,451 | B1 | 4/2002 | Choi | |
| 6,650,023 | B2 * | 11/2003 | Kim | ............................ 257/797 |
| 6,749,906 | B2 | 6/2004 | Van Slyke | |
| 6,776,847 | B2 * | 8/2004 | Yamazaki et al. | ............ 118/724 |

(Continued)

FOREIGN PATENT DOCUMENTS

| | | |
|---|---|---|
| EP | 1 413 644 | 4/2004 |
| EP | 1 418 250 A2 | 5/2004 |

(Continued)

OTHER PUBLICATIONS

U.S. Appl. 13/031,756, filed Feb. 22, 2011, Yong Sup Choi et al., Samsung Mobile Display Co., Ltd.

(Continued)

*Primary Examiner* — Charles Garber
*Assistant Examiner* — Ron Pompey
(74) *Attorney, Agent, or Firm* — Christie, Parker & Hale, LLP

(57) ABSTRACT

A thin film deposition apparatus and a method of manufacturing an organic light-emitting display device by using the same, and more particularly, to a thin film deposition apparatus that can remove a deposition material deposited on a patterning slit sheet without performing an additional cleaning process, and a method of manufacturing an organic light-emitting display device by using the thin film deposition apparatus.

11 Claims, 14 Drawing Sheets

U.S. PATENT DOCUMENTS

| | | | |
|---|---|---|---|
| 7,910,386 B2 * | 3/2011 | Shiang et al. ................... | 438/22 |
| 8,022,448 B1 * | 9/2011 | Luu et al. ...................... | 257/288 |
| 8,128,753 B2 * | 3/2012 | Bulovic et al. ................ | 118/722 |
| 2001/0006827 A1 | 7/2001 | Yamazaki et al. | |
| 2002/0076847 A1 | 6/2002 | Yamada et al. | |
| 2002/0168577 A1 | 11/2002 | Yoon | |
| 2003/0101937 A1 | 6/2003 | Van Slyke et al. | |
| 2003/0124764 A1 * | 7/2003 | Yamazaki et al. .............. | 438/99 |
| 2003/0168013 A1 | 9/2003 | Freeman et al. | |
| 2003/0173896 A1 * | 9/2003 | Grushin et al. ................ | 313/506 |
| 2003/0221614 A1 | 12/2003 | Kang et al. | |
| 2004/0127066 A1 | 7/2004 | Jung | |
| 2004/0134428 A1 | 7/2004 | Sasaki et al. | |
| 2004/0142108 A1 | 7/2004 | Atobe et al. | |
| 2004/0144321 A1 | 7/2004 | Grace et al. | |
| 2004/0194702 A1 | 10/2004 | Sasaki et al. | |
| 2005/0016461 A1 | 1/2005 | Klug et al. | |
| 2005/0031836 A1 | 2/2005 | Hirai | |
| 2005/0037136 A1 | 2/2005 | Yamamoto | |
| 2005/0166842 A1 | 8/2005 | Sakamoto | |
| 2005/0263074 A1 * | 12/2005 | Masuda et al. ................ | 118/726 |
| 2006/0115585 A1 * | 6/2006 | Bulovic et al. ................ | 427/180 |
| 2006/0144325 A1 | 7/2006 | Jung et al. | |
| 2006/0174829 A1 | 8/2006 | An et al. | |
| 2006/0205101 A1 | 9/2006 | Lee et al. | |
| 2007/0024185 A1 * | 2/2007 | Kitamura et al. ............. | 313/504 |
| 2007/0077358 A1 | 4/2007 | Jeong et al. | |
| 2007/0178708 A1 | 8/2007 | Ukigaya | |
| 2008/0018236 A1 | 1/2008 | Arai et al. | |
| 2008/0115729 A1 * | 5/2008 | Oda et al. ....................... | 118/726 |
| 2008/0131587 A1 | 6/2008 | Boroson et al. | |
| 2008/0216741 A1 | 9/2008 | Ling et al. | |
| 2009/0017192 A1 | 1/2009 | Matsuura | |
| 2009/0232976 A1 | 9/2009 | Yoon et al. | |
| 2010/0089443 A1 * | 4/2010 | Bloomstein et al. .......... | 136/255 |
| 2012/0148743 A1 * | 6/2012 | Bulovic et al. ............. | 427/248.1 |

FOREIGN PATENT DOCUMENTS

| | | |
|---|---|---|
| EP | 1 518 940 | 3/2005 |
| JP | 4-272170 | 9/1992 |
| JP | 2000-68054 | 3/2000 |
| JP | 2000-282219 | 10/2000 |
| JP | 2001-52862 | 2/2001 |
| JP | 2001-93667 | 4/2001 |
| JP | 2002-175878 | 6/2002 |
| JP | 2003-3250 | 1/2003 |
| JP | 2003-77662 | 3/2003 |
| JP | 2003-157973 | 5/2003 |
| JP | 2003-297562 | 10/2003 |
| JP | 2004-43898 | 2/2004 |
| JP | 2004-103269 | 4/2004 |
| JP | 2004-103341 | 4/2004 |
| JP | 2004-199919 | 7/2004 |
| JP | 2005-44592 | 2/2005 |
| JP | 2005-235568 | 9/2005 |
| JP | 2005-293968 | 10/2005 |
| JP | 2005-296737 | 10/2005 |
| JP | 2006-275433 | 10/2006 |
| JP | 2007-47293 | 2/2007 |
| JP | 2008-121098 | 5/2008 |
| JP | 2009-19243 | 1/2009 |
| JP | 2009-87910 | 4/2009 |
| KR | 10-0257219 | 2/2000 |
| KR | 10-2000-0019254 | 4/2000 |
| KR | 10-2000-0023929 | 5/2000 |
| KR | 10-2001-0059939 | 7/2001 |
| KR | 10-2002-0000201 | 1/2002 |
| KR | 10-2002-0050922 | 6/2002 |
| KR | 10-2002-0090934 | 12/2002 |
| KR | 10-2004-0034537 | 4/2003 |
| KR | 10-0405080 | 10/2003 |
| KR | 10-2003-0091947 | 12/2003 |
| KR | 10-2003-0093959 | 12/2003 |
| KR | 10-2004-0050045 | 6/2004 |
| KR | 10-2004-0069281 | 8/2004 |
| KR | 10-2004-0084747 | 10/2004 |
| KR | 10-0463212 | 12/2004 |
| KR | 10-0520159 | 9/2005 |
| KR | 10-2006-0008602 | 1/2006 |
| KR | 10-2006-0018745 | 3/2006 |
| KR | 10-2006-0073367 | 6/2006 |
| KR | 10-2006-0080475 | 7/2006 |
| KR | 10-2006-0080481 | 7/2006 |
| KR | 10-2006-0080482 | 7/2006 |
| KR | 10-2006-0083510 | 7/2006 |
| KR | 10-2006-0104675 | 10/2006 |
| KR | 10-2006-0104677 | 10/2006 |
| KR | 10-2006-0109627 | 10/2006 |
| KR | 10-0646160 | 11/2006 |
| KR | 10-0687007 | 2/2007 |
| KR | 10-2007-0025164 | 3/2007 |
| KR | 10-0696547 | 3/2007 |
| KR | 10-0698033 | 3/2007 |
| KR | 10-0700466 | 3/2007 |
| KR | 10-2007-0035796 | 4/2007 |
| KR | 10-0711885 | 4/2007 |
| KR | 10-2007-0050793 | 5/2007 |
| KR | 10-0723627 | 5/2007 |
| KR | 10-0726132 | 6/2007 |
| KR | 10-2007-0078713 | 8/2007 |
| KR | 10-2007-0080635 | 8/2007 |
| KR | 10-2007-0101842 | 10/2007 |
| KR | 10-2007-0105595 | 10/2007 |
| KR | 10-0770653 | 10/2007 |
| KR | 10-2008-0001184 | 1/2008 |
| KR | 10-0797787 | 1/2008 |
| KR | 10-0800125 | 1/2008 |
| KR | 10-0815265 | 3/2008 |
| KR | 10-0823508 | 4/2008 |
| KR | 10-0827760 | 4/2008 |
| KR | 10-2008-0044775 | 5/2008 |
| KR | 10-0839380 | 6/2008 |
| KR | 10-2008-0060400 | 7/2008 |
| KR | 10-2008-0061132 | 7/2008 |
| KR | 10-2008-0062212 | 7/2008 |
| KR | 10-2009-0038733 | 4/2009 |
| KR | 10-2009-0097453 | 9/2009 |
| KR | 10-2009-0107702 | 10/2009 |

OTHER PUBLICATIONS

KIPO Office action dated Feb. 1, 2012, for Korean priority 10-2010-0013847, 5 pages.

English-language abstract of Korean Publication No. KR 10-2002-0034272.

English-language abstract of Korean Publication No. KR 10-2002-0056238.

English-language abstract of Korean Publication No. KR 10-2002-0088662.

English-language abstract of Korean Publication No. KR 10-2005-0045619.

English-language abstract of Korean Publication No. KR 10-2006-0126267.

English-language abstract of Korean Publication No. KR 10-2008-0038650.

U.S. Appl. No. 12/784,774, filed May 21, 2010, Choong-Ho Lee et al., Samsung Mobile Display Co., Ltd.

U.S. Appl. No. 13/014,225, filed Jan. 26, 2011, Jong-Won Hong et al., Samsung Mobile Display Co., Ltd.

U.S. Appl. No. 12/797,858, filed Jun. 10, 2010, Choong-Ho Lee et al., Samsung Mobile Display Co., Ltd.

U.S. Appl. No. 12/836,760, filed Jul. 15, 2010, Jong-Heon Kim, et al., Samsung Mobile Display Co., Ltd.

U.S. Appl. No. 12/784,804, filed May 21, 2010, Choong-Ho Lee, et al., Samsung Mobile Display Co., Ltd.

U.S. Appl. No. 12/849,193, filed Aug. 3, 2010, Ji-Sook Oh et al., Samsung Mobile Display Co., Ltd.

U.S. Appl. No. 12/979,193, filed Dec. 28, 2010, Hyun Sook Park et al., Samsung Mobile Display Co., Ltd.

U.S. Appl. No. 12/820,355, filed Jun. 22, 2010, Yong-Sup Choi et al., Samsung Mobile Display Co., Ltd.

U.S. Appl. No. 12/950,361, filed Nov. 19, 2010, Choong-Ho Lee, et al., Samsung Mobile Display Co., Ltd.

U.S. Appl. No. 12/795,896, filed Jun. 8, 2010, Jung-Min Lee, et al., Samsung Mobile Display Co., Ltd.
U.S. Appl. No. 12/814,816, filed Jun. 14, 2010, Jung-Min Lee et al., Samsung Mobile Display Co., Ltd.
U.S. Appl. No. 12/868,099, filed Aug. 25, 2010, Hee-Cheol Kang, et al., Samsung Mobile Display Co., Ltd.
U.S. Appl. No. 12/862,153, filed Aug. 24, 2010, Hee-Cheol Kang, et al., Samsung Mobile Display Co., Ltd.
U.S. Appl. No. 12/869,830, filed Aug. 27, 2010, Chang-Mog Jo, et al., Samsung Mobile Display Co., Ltd.
U.S. Appl. No. 12/849,092, filed Aug. 3, 2010, Choong-Ho Lee et al., Samsung Mobile Display Co., Ltd.
U.S. Appl. No. 12/873,556, filed Sep. 1, 2010, Young-Mook Choi, et al., Samsung Mobile Display Co., Ltd.
U.S. Appl. No. 12/873,689, filed Sep. 1, 2010, Young-Mook Choi, et al., Samsung Mobile Display Co., Ltd.
U.S. Appl. No. 12/815,673, filed Jun. 15, 2010, Jung-Min Lee, Samsung Mobile Display Co., Ltd.
U.S. Appl. No. 12/794,093, filed Jun. 4, 2010, Jung-Min Lee et al., Samsung Mobile Display Co., Ltd.
U.S. Appl. No. 12/862,125, filed Aug. 24, 2010, Jae-Kwang Ryu et al., Samsung Mobile Display Co., Ltd.
U.S. Appl. No. 12/795,001, filed Jun. 7, 2010, Choong-Ho Lee et al., Samsung Mobile Display Co., Ltd.
U.S. Appl. No. 12/813,786, filed Jun. 11, 2010, Choong-Ho Lee et al., Samsung Mobile Display Co., Ltd.
U.S. Appl. No. 12/820,270, filed Jun. 22, 2010, Jung-Min Lee et al., Samsung Mobile Display Co., Ltd.
U.S. Appl. No. 12/907,396, filed Oct. 19, 2010, Yong-Sup Choi, et al., Samsung Mobile Display Co., Ltd.
U.S. Appl. No. 12/987,569, filed Jan. 10, 2011, Yun-Mi Lee et al., Samsung Mobile Display Co., Ltd.
U.S. Appl. No. 12/984,289, filed Jan. 4, 2011, Jung-Yeong Kim at al., Samsung Mobile Display Co., Ltd.
KIPO Notice of Allowance dated Sep. 1, 2012, for Korean priority Patent application 10-2010-0013847, (5 pages).

* cited by examiner

THIN FILM DEPOSITION APPARATUS AND METHOD OF MANUFACTURING ORGANIC LIGHT-EMITTING DISPLAY DEVICE BY USING THE SAME

CROSS-REFERENCE TO RELATED APPLICATIONS

This application claims the benefit of Korean Patent Applications No. 10-2009-0078837, filed on Aug. 25, 2009, and No. 10-2010-0013847, filed on Feb. 16, 2010, in the Korean Intellectual Property Office, the disclosures of which are incorporated herein in their entirety by reference.

BACKGROUND OF THE INVENTION

1. Field of the Invention

Aspects of the present invention relate to a thin film deposition apparatus and a method of manufacturing an organic light-emitting display device by using the same, and more particularly, to a thin film deposition apparatus that can be used to manufacture large-sized display devices on a mass scale and that improves manufacturing yield, and a method of manufacturing an organic light-emitting display device by using the thin film deposition apparatus.

2. Description of the Related Art

Organic light-emitting display devices have a larger viewing angle, better contrast characteristics, and a faster response rate than other display devices, and thus have drawn attention as a next-generation display device.

In general, organic light-emitting display devices have a stacked structure including an anode, a cathode, and an emission layer interposed between the anode and the cathode, and display images in color when holes and electrons, injected respectively from the anode and the cathode, recombine in the emission layer and thus emit light. However, it is difficult to achieve high light-emission efficiency with such a structure, and thus intermediate layers, including an electron injection layer, an electron transport layer, a hole transport layer, a hole injection layer, etc., are optionally additionally interposed between the emission layer and each of the electrodes.

Also, it is very difficult to form fine patterns in organic thin films such as the emission layer and the intermediate layers. Therefore, red, green, and blue light-emission efficiency varies according to the organic thin films. For these reasons, it is not easy to form an organic thin film pattern on a large substrate, such as a mother glass having a size of 5 G or more, by using a conventional thin film deposition apparatus, and thus it is difficult to manufacture large organic light-emitting display devices having satisfactory driving voltage, current density, brightness, color purity, light-emission efficiency, life-span characteristics. Thus, there is a demand for improvement in this regard.

An organic light-emitting display device includes intermediate layers, including an emission layer disposed between a first electrode and a second electrode that are arranged opposite to each other. The interlayer and the first and second electrodes may be formed using a variety of methods one of which is a deposition method. When an organic light-emitting display device is manufactured by using the deposition method, a fine metal mask (FMM) having the same pattern as a thin film to be formed is closely disposed to a substrate, and a thin film material is deposited over the FMM in order to form the thin film having the desired pattern.

SUMMARY OF THE INVENTION

According to an aspect of the present invention, there is provided a thin film deposition apparatus that can remove a deposition material deposited on a patterning slit sheet without performing a process of cleaning the patterning slit sheet. According to another aspect of the present invention, there is provided a thin film deposition apparatus that can be used to manufacture large display devices on a mass scale and that improves manufacturing yield. According to another aspect of the present invention, there is provided a thin film deposition apparatus that can easily reuse the deposition material, and that improves a thickness uniformity of the deposition material According to another aspect of the present invention, there is provided a method of manufacturing an organic light emitting display by using the thin film deposition apparatus.

According to an aspect of the present invention, there is provided a thin film deposition apparatus to form a thin film on a substrate, the apparatus including: a deposition source that discharges a deposition material; a deposition source nozzle unit disposed at a side of the deposition source and including a plurality of deposition source nozzles arranged in a first direction; a patterning slit sheet disposed opposite to the deposition source nozzle unit and including a plurality of patterning slits arranged in the first direction; a plurality of heat dissipation units disposed on the patterning slit sheet; and a barrier plate assembly disposed between the deposition source nozzle unit and the patterning slit sheet in the first direction, and including a plurality of barrier plates that partition a space between the deposition source nozzle unit and the patterning slit sheet into a plurality of sub-deposition spaces, wherein the thin film deposition apparatus is separated from the substrate by a predetermined distance, and the thin film deposition apparatus and the substrate are movable relative to each other.

The heat dissipation units may be disposed on a surface of the patterning slit sheet facing the deposition source.

According to another aspect of the present invention, the heat dissipation units may heat the patterning slit sheet to remove the deposition material deposited on the patterning slit sheet.

The heat dissipation units may heat the patterning slit sheet to the temperature, at which the deposition material is vaporized, or higher.

The heat dissipation units may heat the patterning slit sheet while the deposition source stops discharging the deposition material.

The heat dissipation units may maintain the temperature of the patterning slit sheet constantly after heating the patterning slit sheet.

According to an aspect of the present invention, the heat dissipation unit may include a coil heater.

The heat dissipation unit may include a thin film heater.

The thin film deposition apparatus may further include a heat insulating member disposed between the heat dissipation units and the patterning slit sheet.

The patterning slit sheet may further include patterning ribs each of which is disposed between neighboring patterning slits, and the heat dissipation units are disposed on the patterning ribs.

Each of the barrier plates may extend in a second direction that is substantially perpendicular to the first direction, in order to partition the space between the deposition source nozzle unit and the patterning slit sheet into the plurality of sub-deposition spaces.

According to another aspect of the present invention, the plurality of barrier plates may be arranged at equal intervals.

The barrier plates may be separated from the patterning slit sheet by a predetermined distance.

Each of the barrier plate assemblies may include a first barrier plate assembly including a plurality of first barrier plates, and a second barrier plate assembly including a plurality of second barrier plates.

Each of the first barrier plates and each of the second barrier plates may extend in the second direction that is substantially perpendicular to the first direction, in order to partition the space between the deposition source nozzle unit and the patterning slit sheet into the plurality of sub-deposition spaces.

The first barrier plates may be arranged to respectively correspond to the second barrier plates.

Each pair of the first and second barrier plates corresponding to each other may be arranged on substantially the same plane.

According to another aspect of the present invention, there is provided a thin film deposition apparatus to form a thin film on a substrate, the apparatus including: a deposition source that discharges a deposition material; a deposition source nozzle unit disposed at a side of the deposition source and including a plurality of deposition source nozzles arranged in a first direction; a patterning slit sheet disposed opposite to the deposition source nozzle unit and comprising a plurality of patterning slits arranged in a second direction that is perpendicular to the first direction; heat dissipation units disposed on the patterning slit sheet; wherein a deposition is performed while the substrate or the thin film deposition apparatus moves relative to each other in the first direction, and the deposition source, the deposition source nozzle unit, and the patterning slit sheet are integrally formed.

According to another aspect of the present invention, there is provided a method of manufacturing an organic light-emitting display device by using a thin film deposition apparatus to form a thin film on a substrate, the method including: arranging the substrate to be separated from the thin film deposition apparatus by a predetermined distance; and depositing a deposition material discharged from the thin film deposition apparatus onto the substrate while the thin film deposition apparatus or the substrate is moved relative to each other.

The depositing of the deposition material on the substrate may further include the deposition material discharged from the thin film deposition apparatus is continuously deposited on the substrate while the substrate or the thin film deposition apparatus is moved relative to each other.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
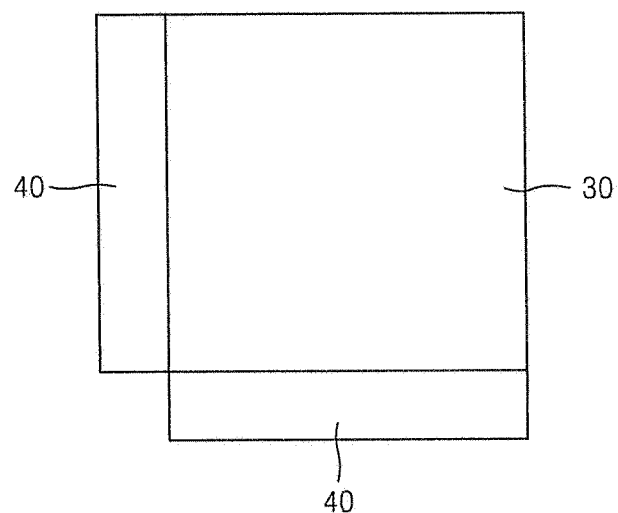
FIG. 1 is a plan view of an organic light-emitting display device manufactured by using a thin film deposition apparatus, according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures. Moreover, it is to be understood that where is stated herein that one film or layer is "formed on" or "disposed on" a second layer or film, the first layer or film may be formed or disposed directly on the second layer or film or there may be intervening layers or films between the first layer or film and the second layer or film. Further, as used herein, the term "formed on" is used with the same meaning as "located on" or "disposed on" and is not meant to be limiting regarding any particular fabrication process.

FIG. 1 is a plan view of an organic light-emitting display device manufactured by using a thin film deposition apparatus according to an embodiment of the present invention.

Referring to FIG. 1, the organic light-emitting display device includes a pixel region 30 and circuit regions 40 disposed at edges of the pixel region 30. The pixel region 30 includes a plurality of pixels, and each of the pixels includes an emission unit that emits light to display an image.

In an embodiment of the present invention, the emission unit may include a plurality of sub-pixels, each of which includes an organic light-emitting diode (OLED). In a full-color organic light-emitting display device, red (R), green (G) and blue (B) sub-pixels are arranged in various patterns, for example, in a line, mosaic, or lattice pattern, to constitute a pixel. However, the organic light-emitting display device may be a monochromatic flat display device, not a full-color flat display device.

The circuit regions 40 control, for example, an image signal that is input to the pixel region 30. In the organic light-emitting display device, at least one thin film transistor (TFT) may be installed in each of the pixel region 30 and the circuit region 40.

The at least one TFT installed in the pixel region 30 may include a pixel TFT, such as a switching TFT that transmits a data signal to an OLED according to a gate line signal to control the operation of the OLED, and a driving TFT that drives the OLED by supplying current according to the data signal. The at least one TFT installed in the circuit region 40 may include a circuit TFT used to implement a predetermined circuit.

The number and arrangement of TFTs may vary according to the features of the display device and the driving method thereof.

Figure 2:
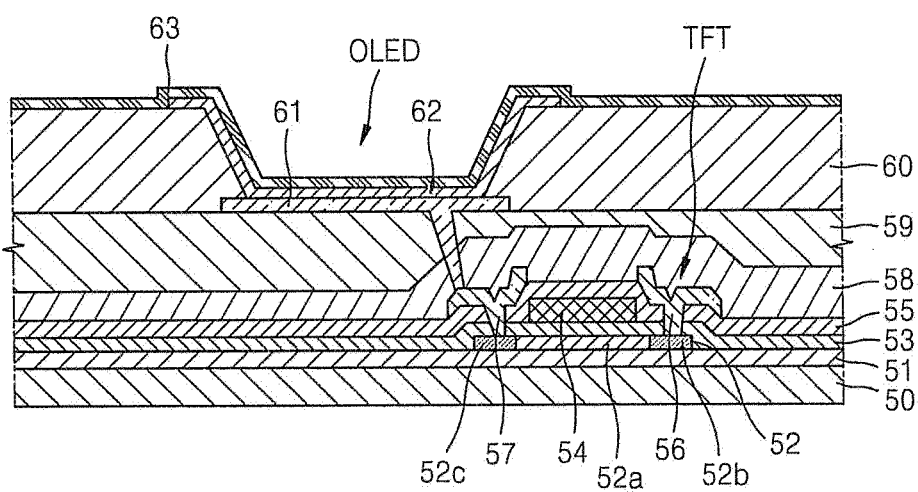
FIG. 2 is a sectional view of a sub-pixel of the organic light-emitting display device illustrated in FIG. 1, according to an embodiment of the present invention.

FIG. 2 is a cross-sectional view of a sub-pixel of the organic light-emitting display device illustrated in FIG. 1, according to an embodiment of the present invention.

Referring to FIG. 2, a buffer layer 51 is formed on a substrate 50 formed of glass or plastic. A TFT and an OLED are formed on the buffer layer 51.

An active layer 52 having a predetermined pattern is formed on the buffer layer 51 on the substrate 50. A gate insulating layer 53 is formed on the active layer 52, and a gate electrode 54 is formed in a predetermined region of the gate insulating layer 53. The gate electrode 54 is connected to a gate line (not shown) that applies a TFT ON/OFF signal. An interlayer insulating layer 55 is formed on the gate electrode 54. Source/drain electrodes 56 and 57 are formed such as to contact source/drain regions 52b and 52c, respectively, of the active layer 52 through contact holes. A passivation layer 58 is formed of $SiO_2$, $SiN_x$, etc. on the source/drain electrodes 56 and 57. A planarization layer 59 is formed of an organic material, such as acryl, polyimide, benzocyclobutene (BCB), etc., on the passivation layer 58. A pixel electrode 61, which functions as an anode of the OLED, is formed on the planarization layer 59, and a pixel defining layer 60 formed of an organic material is formed to cover the pixel electrode 61. An opening is formed in the pixel defining layer 60, and an organic layer 62 is formed on a surface of the pixel defining layer 60 and on a surface of the pixel electrode 61 exposed through the opening. The organic layer 62 includes an emission layer. The aspects of the present invention are not limited to the structure of the organic light-emitting display device described above, and various structures of organic light-emitting display devices may be applied to the aspects of the present invention.

The OLED displays predetermined image information by emitting red, green and blue light as current flows. The OLED includes the pixel electrode 61, which is connected to the drain electrode 57 of the TFT and to which a positive power voltage is applied, a counter electrode 63, which is formed so as to cover the entire sub-pixel and to which a negative power voltage is applied, and the organic layer 62, which is disposed between the pixel electrode 61 and the counter electrode 63 to emit light.

The pixel electrode 61 and the counter electrode 63 are insulated from each other by the organic layer 62, and respectively apply voltages of opposite polarities to the organic layer 62 to induce light emission in the organic layer 62.

The organic layer 62 may include a low-molecular weight organic layer or a high-molecular weight organic layer. When a low-molecular weight organic layer is used as the organic layer 62, the organic layer 62 may have a single or multi-layer structure including at least one selected from the group consisting of a hole injection layer (HIL), a hole transport layer (HTL), an emission layer (EML), an electron transport layer (ETL), an electron injection layer (EIL), etc. Examples of available organic materials include copper phthalocyanine (CuPc), N,N'-di(naphthalene-1-yl)-N,N'-diphenyl-benzidine (NPB), tris-8-hydroxyquinoline aluminum (Alq3), etc. The low-molecular weight organic layer may be formed by vacuum deposition.

When a high-molecular weight organic layer is used as the organic layer 62, the organic layer 62 may mostly have a structure including a HTL and an EML. In this case, the HTL may be formed of poly(ethylenedioxythiophene) (PEDOT), and the EML may be formed of polyphenylenevinylenes (PPVs) or polyfluorenes. The HTL and the EML may be formed by screen printing, inkjet printing, or the like.

The organic layer 62 is not limited to the organic layers described above, and may be embodied in various ways.

The pixel electrode 61 functions as an anode, and the counter electrode 63 functions as a cathode. Alternatively, the pixel electrode 61 may function as a cathode, and the counter electrode 63 may function as an anode.

The pixel electrode 61 may be formed as a transparent electrode or a reflective electrode. Such a transparent electrode may be formed of indium tin oxide (ITO), indium zinc oxide (IZO), zinc oxide (ZnO), or indium oxide ($In_2O_3$). Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer of ITO, IZO, ZnO, or $In_2O_3$ on the reflective layer.

The counter electrode 63 may be formed as a transparent electrode or a reflective electrode. When the counter electrode 63 is formed as a transparent electrode, the counter electrode 63 functions as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic layer 62 and forming an auxiliary electrode layer or a bus electrode line thereon from a transparent electrode forming material, such as ITO, IZO, ZnO, $In_2O_3$, or the like. When the counter electrode 63 is formed as a reflective electrode, the reflective layer may be formed by depositing Li, Ca, LiF/Ca, LiF/Al, Al, Ag, Mg, or a compound thereof on the entire surface of the organic layer 62.

In the organic light-emitting display apparatus described above, the organic layer 62 including the emission layer may be formed by using a thin film deposition apparatus 100 (see FIG. 3), which will be described later.

Hereinafter, a thin film deposition apparatus according to an embodiment of the present invention and a method of manufacturing an organic light-emitting display device by using the thin film deposition apparatus will be described in detail.

Figure 3:
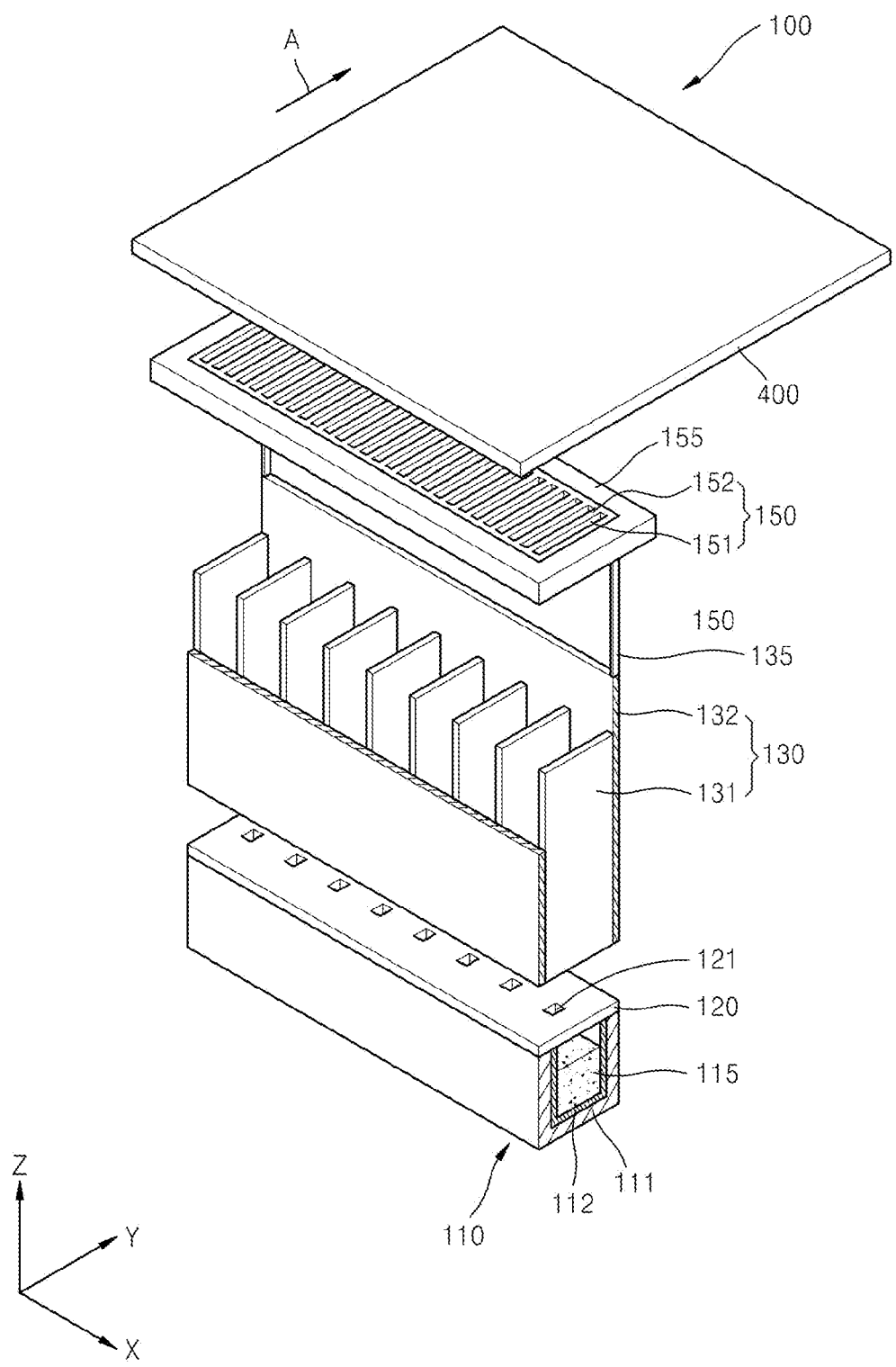
FIG. 3 is a schematic perspective view of a thin film deposition apparatus according to an embodiment of the present invention.
Figure 4:
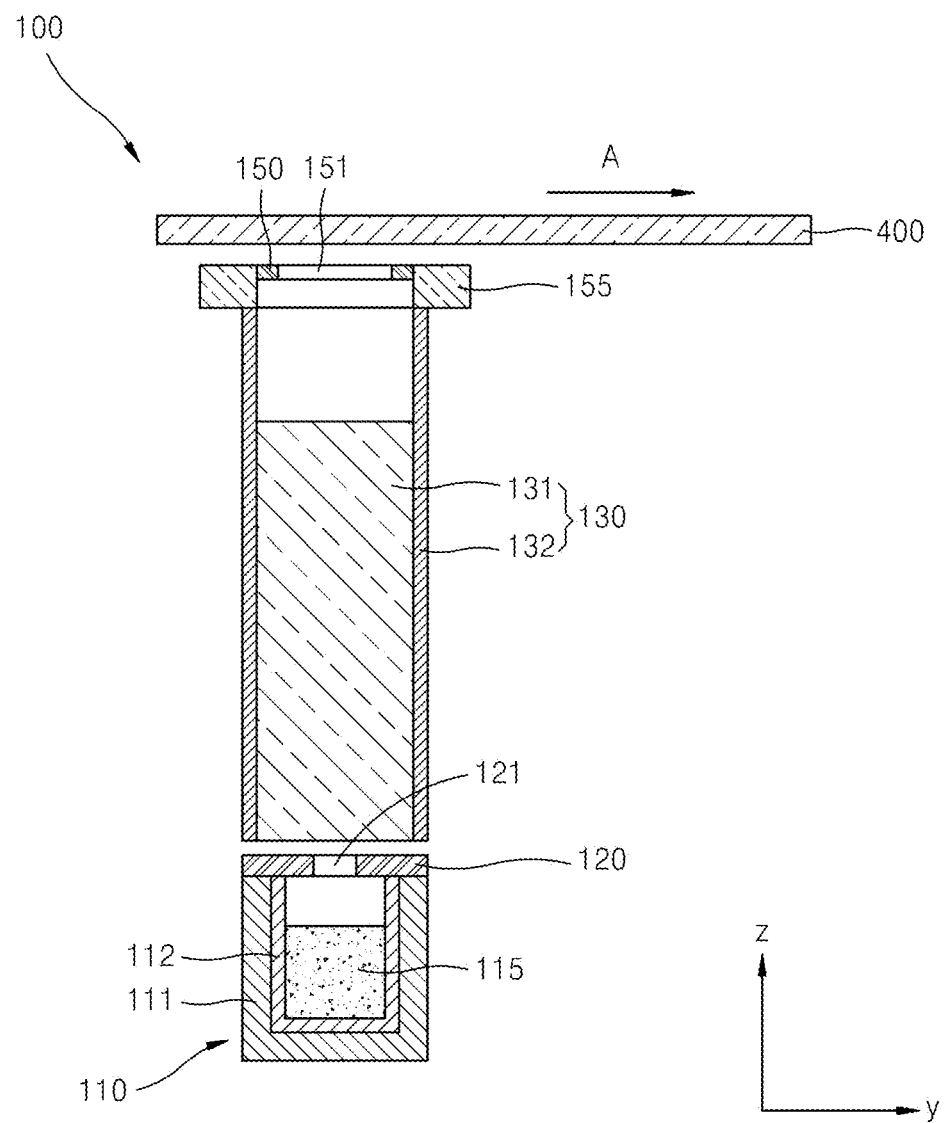
FIG. 4 is a schematic sectional view of the thin film deposition apparatus illustrated in FIG. 3, according to an embodiment of the present invention.
Figure 5:
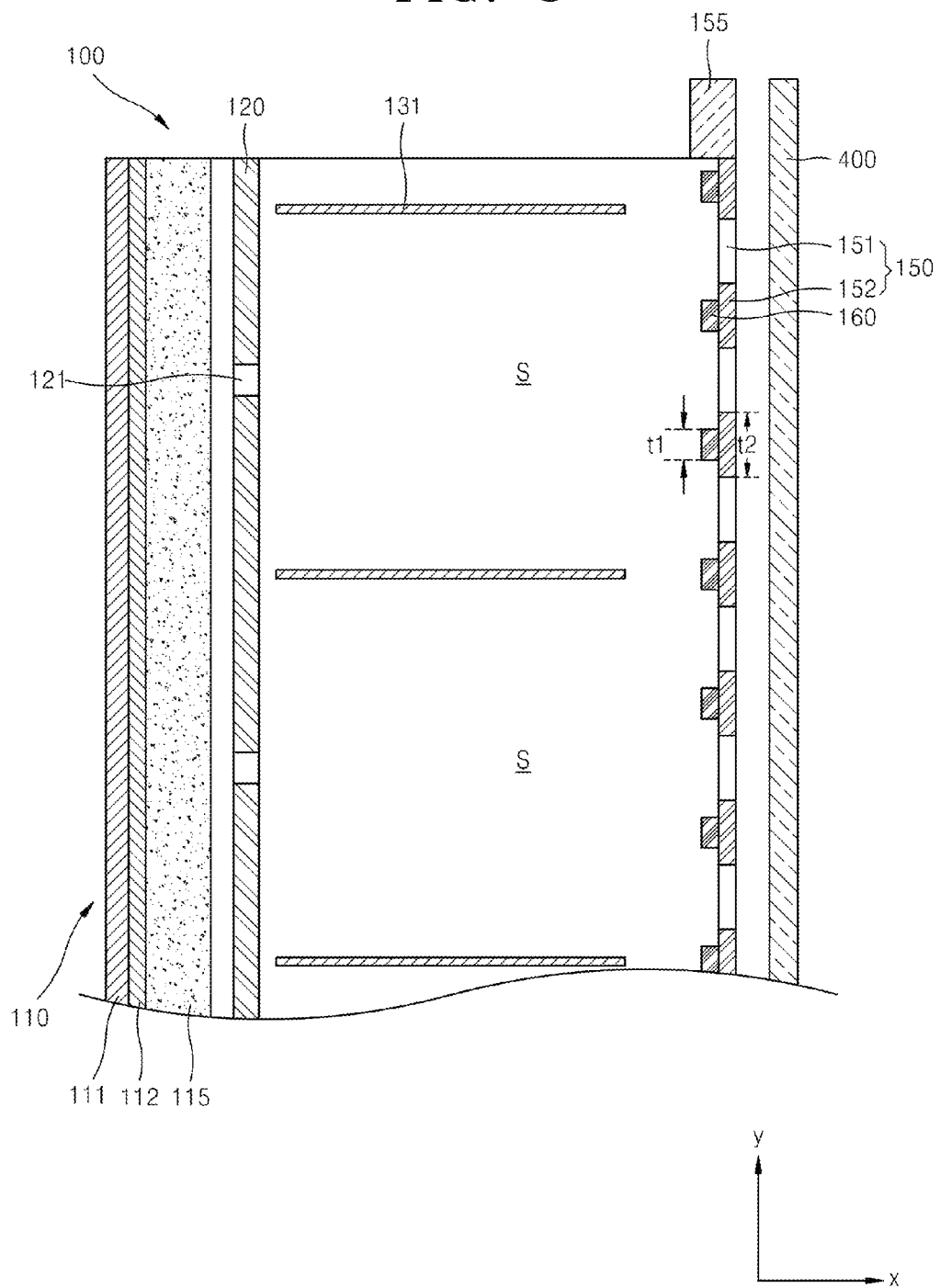
FIG. 5 is a schematic plan view of the thin film deposition apparatus illustrated in FIG. 3, according to an embodiment of the present invention.

FIG. 3 is a schematic perspective view of a thin film deposition apparatus 100 according to an embodiment of the present invention, FIG. 4 is a schematic sectional view of the thin film deposition apparatus 100 illustrated in FIG. 3, and FIG. 5 is a schematic plan view of the thin film deposition apparatus 100 illustrated in FIG. 3.

Referring to FIGS. 3, 4 and 5, the thin film deposition apparatus 100 according to an embodiment of the present invention includes a deposition source 110, a deposition source nozzle unit 120, a barrier plate assembly 130, a patterning slit sheet 150, and a plurality of heat dissipation units 160.

Although a chamber is not illustrated in FIGS. 3, 4 and 5 for convenience of explanation, all the components of the thin film deposition apparatus 100 may be disposed within a chamber that is maintained at an appropriate degree of vacuum. The chamber is maintained at an appropriate vacuum in order to allow a deposition material to move in a substantially straight line through the thin film deposition apparatus 100.

In particular, in order to deposit a deposition material 115 that is emitted from the deposition source 110 and is discharged through the deposition source nozzle unit 120 and the patterning slit sheet 150, onto a substrate 400 in a desired pattern, it is required to maintain the chamber in a high-vacuum state as in a deposition method using a fine metal mask (FMM). In addition, the temperatures of barrier plates 131 and the patterning slit sheet 150 have to be sufficiently lower than the temperature of the deposition source 110. The temperatures of the barrier plates 131 and the patterning slit sheet 150 may be maintained at room temperature because when the temperatures of the barrier plates 131 and the patterning slit sheet 150 are higher than room temperature, the deposition material 115 adhered to the barrier plates 131 and the patterning slit sheet 150 may be vaporized and the patterning slit sheet 150 may be thermally expanded, thereby degrading accuracy of the patterning operation.

If the temperatures of the barrier plate assembly 130 and the patterning slit sheet 150 are sufficiently low, that is, at room temperature, the deposition material 115 discharged in an undesired direction is adhered to surfaces of the barrier plate assembly 130 and is not vaporized again. Therefore, a shadow zone formed in a thin film pattern formed on the substrate 400 may be reduced. The barrier plate assembly 130 faces the deposition source 110 which is at a high temperature. In addition, the temperature of a portion of the barrier plate assembly 130 close to the deposition source 110 rises by a maximum of about 167° C., and thus a partial-cooling apparatus may be further included if needed. To this end, the barrier plate assembly 130 may include a cooling member (not shown).

The substrate 400, which constitutes a target on which a deposition material 115 is to be deposited, is disposed in the chamber. The substrate 400 may be a substrate for flat panel displays. A large substrate, such as a mother glass, for manufacturing a plurality of flat panel displays, may be used as the substrate 160. Other substrates may also be employed.

In an embodiment of the present invention, deposition may be performed while the substrate 400 or the thin film deposition apparatus 100 is moved relative to each other.

In particular, in the conventional FMM deposition method, the size of the FMM has to be equal to the size of a substrate. Thus, the size of the FMM has to be increased as the substrate becomes larger. However, it is neither straightforward to manufacture a large FMM nor to extend an FMM to be accurately aligned with a pattern.

In order to overcome this problem, in the thin film deposition apparatus 100 deposition may be performed while the thin film deposition apparatus 100 or the substrate 400 is moved relative to each other. In other words, deposition may be continuously performed while the substrate 400, which is disposed so as to face the thin film deposition apparatus 100, is moved in a Y-axis direction. That is, deposition is performed in a scanning manner. Although the substrate 400 is illustrated as being moved in the Y-axis direction in FIG. 3 when deposition is performed, the aspects of the present invention are not limited thereto. Deposition may be performed while the thin film deposition apparatus 100 is moved in the Y-axis direction, whereas the substrate 400 is fixed.

Thus, in the thin film deposition apparatus 100 the patterning slit sheet 150 may be significantly smaller than an FMM used in a conventional deposition method. In other words, in the thin film deposition apparatus 100 deposition is continuously performed, i.e., in a scanning manner while the substrate 400 is moved in the Y-axis direction. Thus, provided that lengths of the patterning slit sheet 150 in the X-axis direction and the substrate 400 in the X-axis direction are substantially equal to each other, the length of the patterning slit sheet 150 in the Y-axis direction may be significantly less than the length of the substrate 400 in the Y-axis direction. As described above, since the patterning slit sheet 150 may be formed to be significantly smaller than an FMM used in a conventional deposition method, it is relatively easy to manufacture the patterning slit sheet 150 according to an embodiment of the present invention. In other words, using the patterning slit sheet 150, which is smaller than an FMM used in a conventional deposition method, is more convenient in all processes, including etching and subsequent other processes, such as precise extension, welding, moving, and cleaning processes, compared to the conventional deposition method using the larger FMM. Therefore the patterning slit sheet 150 is more advantageous than the conventional FMM when used for a relatively large display device.

In order to perform deposition while the thin film deposition apparatus 100 or the substrate 400 is moved relative to each other as described above, the thin film deposition apparatus 100 and the substrate 400 may be separated from each other by a predetermined distance. This will be described later in detail.

The deposition source 110 that contains and heats the deposition material 115 is disposed in an opposite side of the chamber to that in which the substrate 400 is disposed. As the deposition material 115 contained in the deposition source 110 is vaporized, the deposition material 115 is deposited on the substrate 400.

In particular, the deposition source 110 includes a crucible 111 that is filled with the deposition material 115, and a heater 112 that heats the crucible 111 to vaporize the deposition material 115, which is contained in the crucible 111, towards a side of the crucible 111, and in particular, towards the deposition source nozzle unit 120.

The deposition source nozzle unit 120 is disposed at a side of the deposition source 110, and in particular, at the side of the deposition source 110 facing the substrate 400. The deposition source nozzle unit 120 includes a plurality of deposition source nozzles 121 arranged at equal intervals in the X-axis direction. The deposition material 115 that is vaporized in the deposition source 110, passes through the deposition source nozzle unit 120 towards the substrate 400.

The barrier plate assembly 130 is disposed at a side of the deposition source nozzle unit 120. The barrier plate assembly 130 includes a plurality of barrier plates 131, and a barrier plate frame 132 that covers sides of the barrier plates 131. The plurality of barrier plates 131 may be arranged parallel to each other at equal intervals in X-axis direction. In addition, each of the barrier plates 131 may be arranged parallel to an YZ plane in FIG. 3, i.e., perpendicular to X-axis direction. The plurality of barrier plates 131 arranged as described above partition the space between the deposition source nozzle unit 120 and the patterning slit sheet 150 into a plurality of sub-deposition spaces S (see FIG. 5). In the thin film deposition apparatus 100 the deposition space is divided by the barrier plates 131 into the sub-deposition spaces S that respectively correspond to the deposition source nozzles 121 through which the deposition material 115 is discharged.

The barrier plates 131 may be respectively disposed between adjacent deposition source nozzles 121. In other words, each of the deposition source nozzles 121 may be disposed between two adjacent barrier plates 131. The deposition source nozzles 121 may be respectively located at the midpoint between two adjacent barrier plates 131. As described above, since the barrier plates 131 partition the space between the deposition source nozzle unit 120 and the patterning slit sheet 150 into the plurality of sub-deposition spaces S, the deposition material 115 discharged through each of the deposition source nozzles 121 is not mixed with the deposition material 115 discharged through the other deposition source nozzles slits 121, and passes through patterning slits 151 so as to be deposited on the substrate 400. In other words, the barrier plates 131 guide the deposition material 115, which is discharged through the deposition source nozzles slits 121, to move straight, and not to flow in the X-axis direction. In addition, the barrier plates 131 cause the deposition material 115 to be incident onto the substrate 400 at a constant angle so as to prevent the formation of a large shadow zone on the substrate 400.

As described above, the deposition material 115 is forced to move straight by installing the barrier plates 131, so that a smaller shadow zone may be formed on the substrate 400 compared to a case where no barrier plates are installed. Thus, the thin film deposition apparatus 100 and the substrate 400 can be separated from each other by a predetermined distance. This will be described later in detail.

The barrier plate frame 132, which forms upper and lower sides of the barrier plates 131, maintains the positions of the barrier plates 131, and guides the deposition material 115, which is discharged through the deposition source nozzles 121, not to flow in the Y-axis direction.

Although the deposition source nozzle unit 120 and the barrier plate assembly 130 are illustrated as being separated from each other by a predetermined distance, the present invention is not limited thereto.

In order to prevent the heat emitted from the deposition source 110 from being conducted to the barrier plate assembly 130, the deposition source nozzle unit 120 and the barrier plate assembly 130 may be separated from each other by a predetermined distance. Alternatively, if a heat insulator is disposed between the deposition source nozzle unit 120 and the barrier plate assembly 130, the deposition source nozzle unit 120 and the barrier plate assembly 130 may be bound together with the heat insulator therebetween.

In addition, the barrier plate assembly 130 may be constructed to be detachable from the thin film deposition apparatus 100. A conventional FMM deposition method has low deposition efficiency. Here, the deposition efficiency means a ratio of the deposition material 115 that is deposited on the substrate 400 to the deposition material 115 vaporized in the deposition source 110. In the conventional FMM deposition method, the deposition efficiency is about 32%, and about 68% of organic deposition material, which has not been deposited on the substrate, remains adhered to a deposition apparatus, and thus it is not easy to reuse the deposition material.

In order to overcome these problems, in the thin film deposition apparatus 100 the deposition space is enclosed by using the barrier plate assembly 130, so that the deposition material 115 that remains undeposited is mostly deposited within the barrier plate assembly 130. Thus, since the barrier plate assembly 130 is constructed to be detachable from the thin film deposition apparatus 100, when a large amount of the deposition material 115 lies in the barrier plate assembly 130 after a long deposition process, the barrier plate assembly 130 may be detached from the thin film deposition apparatus 100 and then placed in a separate deposition material recycling apparatus in order to recover the deposition material 115. Due to the structure of the thin film deposition apparatus 100, a reuse rate of the deposition material 115 is increased, so that the deposition efficiency is improved, and thus the manufacturing costs are reduced.

The patterning slit sheet 150 and a patterning slit sheet frame 155 are disposed between the deposition source 110 and the substrate 400. The patterning slit sheet frame 155 may be formed in a lattice shape, similar to a window frame. The patterning slit sheet 150 is bound inside the patterning slit sheet frame 155. In addition, the patterning slit sheet 150 includes a plurality of patterning slits 151 and a plurality of patterning ribs 152 which are alternately arranged in the X-axis direction. Lengths of the patterning slits 151 corresponding to one deposition space S may not be consistent with each other as shown in FIG. 3 in order to improve a uniformity in thicknesses of the thin films that are formed on the substrate. This will be described later.

The deposition material 115 that is vaporized in the deposition source 110, passes through the deposition source nozzle unit 120 and the patterning slit sheet 150 towards the substrate 400. The patterning slit sheet 150 may be manufactured by etching, which is the same method as used in a conventional method of manufacturing an FMM, and in particular, a striped FMM.

In the thin film deposition apparatus 100, the total number of patterning slits 151 may be greater than the total number of deposition source nozzles 121. In addition, there may be a greater number of patterning slits 151 than deposition source nozzles 121 disposed between two adjacent barrier plates 131.

In other words, at least one deposition source nozzle 121 may be disposed between each two adjacent barrier plates 131. Meanwhile, a plurality of patterning slits 151 may be disposed between each two adjacent barrier plates 131. The space between the deposition source nozzle unit 120 and the patterning slit sheet 150 is partitioned by the barrier plates 131 into sub-deposition spaces S that correspond to the deposition source nozzles 121, respectively. Thus, the deposition material 115 discharged from each of the deposition source nozzles 121 passes through a plurality of patterning slits 151 disposed in the sub-deposition space S corresponding to the deposition source nozzle 121, and is then deposited on the substrate 400.

In addition, the barrier plate assembly 130 and the patterning slit sheet 150 may be formed to be separated from each other by a predetermined distance. Alternatively, the barrier plate assembly 130 and the patterning slit sheet 150 may be connected by a connection member 135. The temperature of the barrier plate assembly 130 may increase to 100° C. or higher due to the deposition source 110 whose temperature is high. Thus, in order to prevent the heat of the barrier plate assembly 130 from being conducted to the patterning slit sheet 150, the barrier plate assembly 130 and the patterning slit sheet 150 are separated from each other by a predetermined distance.

As described above, the thin film deposition apparatus 100 performs deposition while being moved relative to the substrate 400. In order to move the thin film deposition apparatus 100 relative to the substrate 400, the patterning slit sheet 150 is separated from the substrate 400 by a predetermined distance. In addition, in order to prevent the formation of a relatively large shadow zone on the substrate 400 when the patterning slit sheet 150 and the substrate 400 are separated from each other, the barrier plates 131 are arranged between the deposition source nozzle unit 120 and the patterning slit sheet 150 to force the deposition material 115 to move in a straight direction. Thus, the size of the shadow zone formed on the substrate 400 is sharply reduced.

In particular, in a conventional deposition method using an FMM, deposition is performed with the FMM in close contact with a substrate in order to prevent formation of a shadow zone on the substrate. However, when the FMM is used in close contact with the substrate, the contact may cause defects. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

In order to overcome this and/or other problems, in the thin film deposition apparatus 100 according to the current embodiment of the present invention, the patterning slit sheet 150 is disposed to be separated from the substrate 400 by a predetermined distance. This may be facilitated by installing the barrier plates 131 to reduce the size of the shadow zone formed on the substrate 400.

As described above, a mask is formed to be smaller than a substrate, and deposition is performed while the mask is moved relative to the substrate. Thus, the mask can be easily manufactured. In addition, defects caused due to the contact between a substrate and an FMM, which occurs in the conventional deposition method, may be prevented. Furthermore, since it is unnecessary to use the FMM in close contact with the substrate during a deposition process, the manufacturing speed may be improved.

The plurality of heat dissipation units 160 are disposed on the patterning slit sheet 150. The heat dissipation units 160 are disposed on a surface of the patterning slit sheet 150 facing the deposition source 110. In more detail, the patterning slit sheet 150 includes the patterning ribs 152 and the patterning slits 151 that are openings, arranged alternately, and the heat dissipation units 160 may be respectively disposed on the patterning ribs 152. A width t1 of each of the heat dissipation units 160 may be equal to or less than a width t2 of each of the patterning ribs 152.

The heat dissipation units 160 heat the patterning slit sheet 150 to remove the deposition material 115 deposited on the patterning slit sheet 150. In particular, according to the deposition processes using the thin film deposition apparatus 100, the deposition material 115 that is discharged from the deposition source 110 passes through the patterning slits 151 in the patterning slit sheet 150 towards the substrate 400, and some of the deposition material 115 may be deposited on the patterning ribs 152 of the patterning slit sheet 150. While the deposition material 115 is not discharged from the deposition source 110 in the deposition process, the heat dissipation units 160 heat the patterning slit sheet 150 to the vaporization temperature of the deposition material 115 or higher to remove the deposition material 115 deposited on the patterning ribs 152. That is, in the thin film deposition apparatus 100 according to the current embodiment of the present invention, the discharge of deposition material 115 is stopped during the deposition process, and after that the patterning slit sheet 150 is heated by the heat dissipation units 160 to vaporize the deposition material 115 on the pattering ribs 152 in the chamber (not shown), and then, the deposition material 115 is discharged again towards the substrate 400.

Accordingly, in the thin film deposition apparatus 100, the deposition material 115 adhered to the patterning slit sheet 150 is removed in the chamber. Therefore, an additional cleaning process for detaching and cleaning the patterning slit sheet 150 is not necessary, and thus, the thin film deposition process may be simple. In addition, the deposition material 115 adhered to the patterning slit sheet 150 is removed after stopping the discharge of the deposition material 115 during the deposition process, and thus, blockage of the patterning slits 151 is efficiently prevented. In addition, the deposition material 115 removed due to the heat of the heat dissipation units 160 is deposited on the barrier plate assembly 130 again. Thus, the deposition material 115 deposited within the barrier plate assembly 130 is recovered to be reused, thereby increasing the deposition efficiency.

The heat dissipation units 160 maintain the temperature of the patterning slit sheet 150 constant after heating the patterning slit sheet 150. Since the temperature of the patterning slit sheet 150 is maintained constant after being heated, a thermal expansion amount of the patterning slit sheet 150 is maintained constant. Then, when the patterning slit sheet 150 is aligned with the substrate 400 after being thermally expanded, degradation in the uniformity of the deposition patterns caused by the thermal expansion is reduced.

The heat dissipation units 160 may be coil heaters or thin film heaters.

Figure 6:
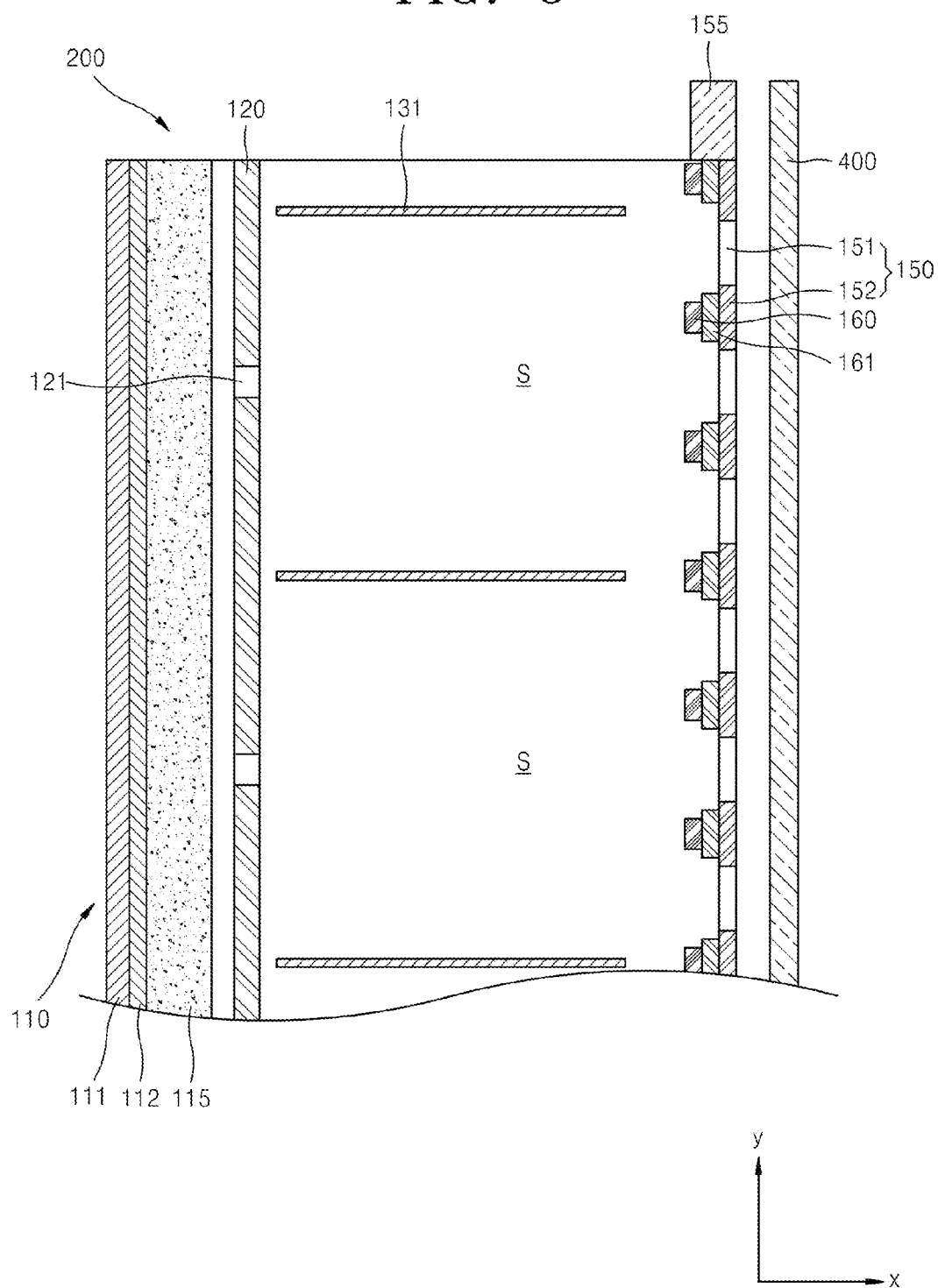
FIG. 6 is a schematic plan view of a thin film deposition apparatus according to another embodiment of the present invention.

FIG. 6 is a plan view of a thin film deposition apparatus 200 according to another embodiment of the present invention.

Referring to FIG. 6, the thin film deposition apparatus 200 is different from the thin film deposition apparatus 100 illustrated in FIG. 5 in that the thin film deposition apparatus 200 further includes a plurality of heat insulating members 161. The heat insulating members 161 are respectively disposed between the heat dissipation units 160 and the patterning slit sheet 150.

Hereinafter, the size of a shadow zone formed on a substrate when barrier plates 131 are installed and the size of a shadow zone formed on a substrate when no barrier plates are installed are compared.

Figure 7A:
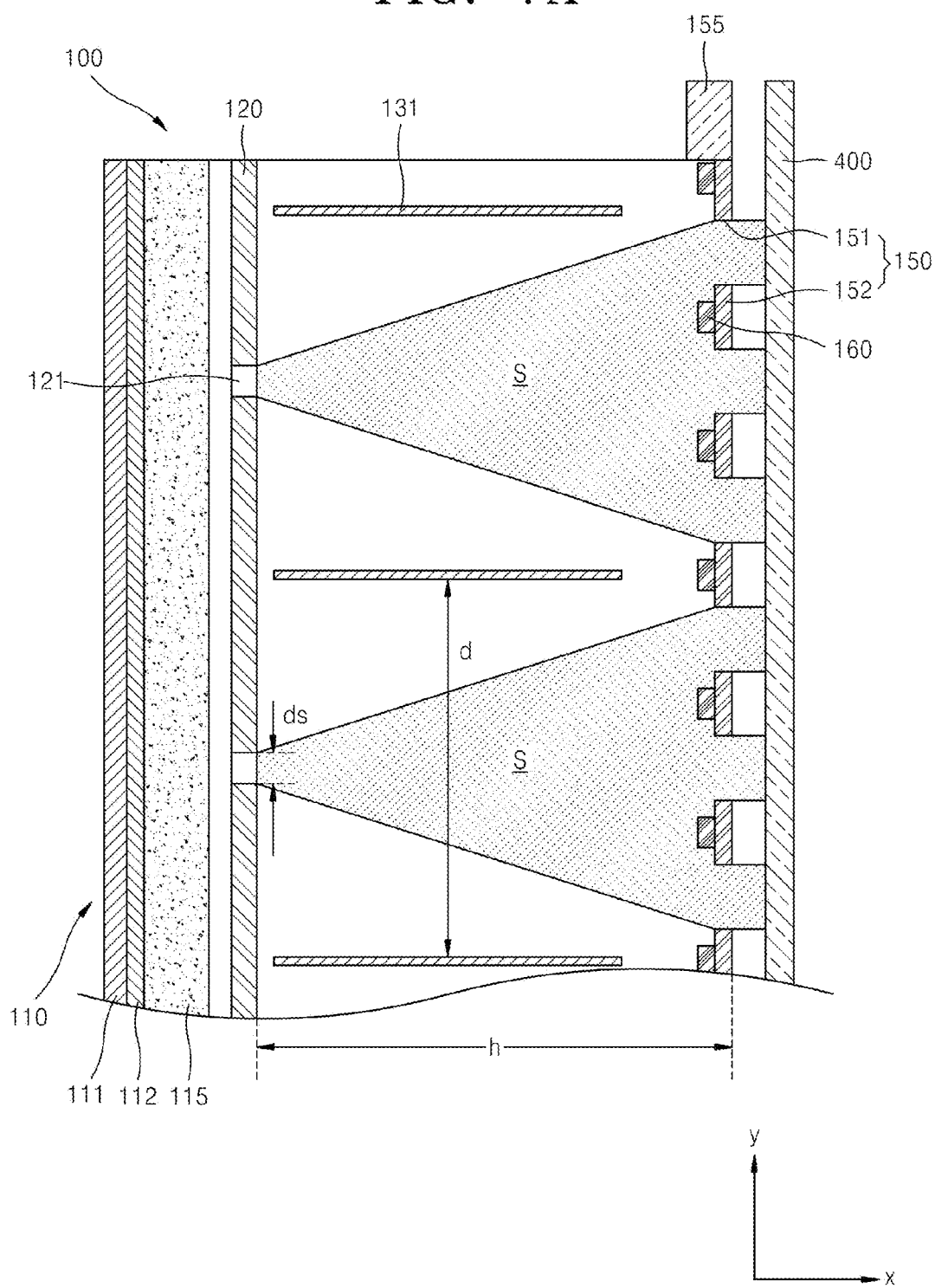
FIG. 7A is a schematic view for describing deposition of a deposition material in the thin film deposition apparatus of FIG. 3, according to an embodiment of the present invention.
Figure 7B:
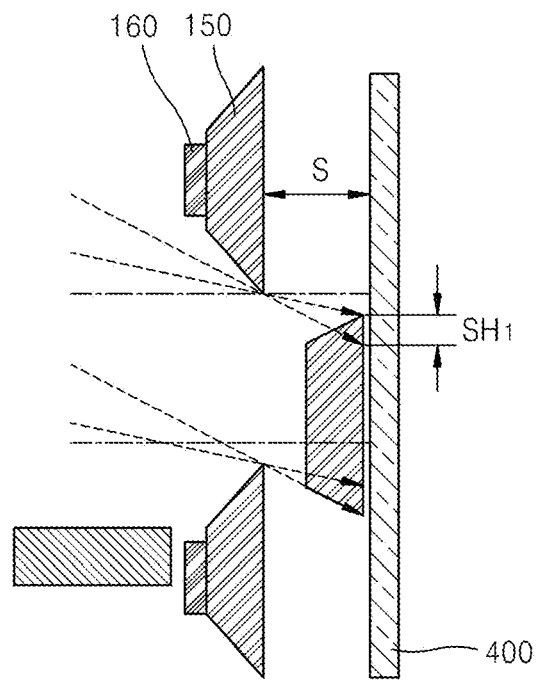
FIG. 7B illustrates a shadow zone of a thin film deposited on a substrate when a deposition space is partitioned by barrier plates, as illustrated in FIG. 7A, according to an embodiment of the present invention.
Figure 7C:
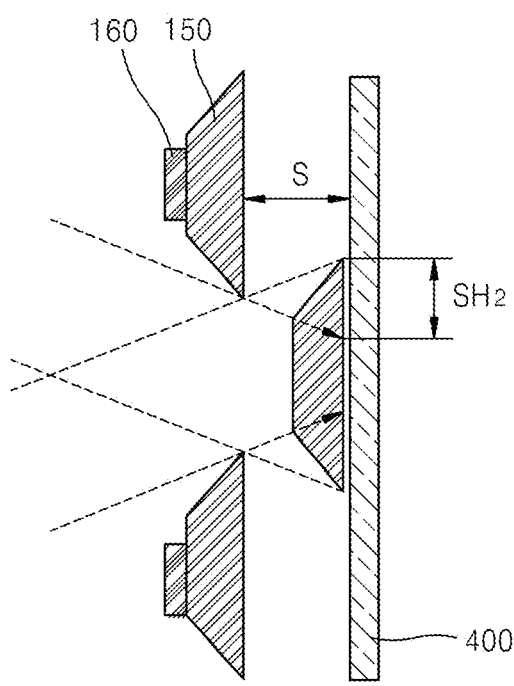
FIG. 7C illustrates a shadow zone of a thin film deposited on the substrate when the deposition space is not partitioned.

FIG. 7A is a schematic view for describing deposition of the deposition material 115 in the thin film deposition apparatus 100, according to an embodiment of the present invention. FIG. 7B illustrates a shadow zone of a thin film deposited on the substrate 400 when the deposition space is partitioned by the barrier plates 131. FIG. 7C illustrates a shadow zone of a thin film deposited on the substrate 400 when the deposition space is not partitioned.

Referring to FIG. 7A, the deposition material 115 that is vaporized in the deposition source 110 is deposited on the substrate 400 by being discharged through the deposition source nozzle unit 120 and the patterning slit sheet 150. Since the space between the deposition source nozzle unit 120 and the patterning slit sheet 150 is partitioned into a plurality of sub-deposition spaces S by the barrier plates 131, the deposition material 115 discharged through each of the deposition source nozzles 121 is not mixed with the deposition material 115 discharged through the other adjacent deposition source nozzles 121 due to the barrier plates 131.

When the space between the deposition source nozzle unit 120 and the patterning slit sheet 150 is partitioned by the barrier plate assembly 130, as illustrated in FIGS. 7A and 7B, a width $SH_1$ of a shadow zone formed on the substrate 400 may be determined using Equation 1 below.

$$SH_1 = s*d_s/h \quad \text{[Equation 1]}$$

where s denotes a distance between the patterning slit sheet 150 and the substrate 400, $d_s$ denotes a width of each of the deposition source nozzles 121, and h denotes a distance between the deposition source 110 and the patterning slit sheet 150.

However, when the space between the deposition source nozzle unit 120 and the patterning slit sheet 150 is not partitioned by the barrier plates 131, as illustrated in FIG. 7C, the deposition material 115 is discharged through the patterning slit sheet 150 in a wider range of angles than in the case of FIG. 7B. This is because the deposition material 115 discharged not just through a deposition source nozzle 121 directly facing a patterning slit 151 but also through deposition source nozzles 121 other than the deposition source nozzle 121 above, passes through the patterning slit 151 above and is then deposited on the substrate 400. Thus, a width $SH_2$ of a shadow zone formed on the substrate 400 is much greater than when the deposition space is partitioned by the barrier plates 131. The width $SH_2$ of the shadow zone formed on the substrate 400 is determined using Equation 2.

$$SH_2 = s*2d/h \quad \text{[Equation 2]}$$

where s denotes a distance between the patterning slit sheet 150 and the substrate 400, d denotes an interval between adjacent barrier plates 131, and h denotes a distance between the deposition source 110 and the patterning slit sheet 150.

Referring to Equations 1 and 2, $d_s$, which is the width of each of the deposition source nozzles 121, is a few to tens times less than d, which is the interval between the adjacent barrier plates 131, and thus the shadow zone may have a smaller width when the space between the deposition source nozzle unit 120 and the patterning slit sheet 150 is partitioned by the barrier plates 131. The width $SH_2$ of the shadow zone formed on the substrate 400 may be reduced by either one of the following: (1) by reducing the interval d between the adjacent barrier plates 131, (2) by reducing the distance s between the patterning slit sheet 150 and the substrate 400, or (3) by increasing the distance h between the deposition source 110 and the patterning slit sheet 150.

As described above, the shadow zone formed on the substrate 400 may be reduced by installing the barrier plates 131. Thus, the patterning slit sheet 150 can be separated from the substrate 400.

Figure 8:
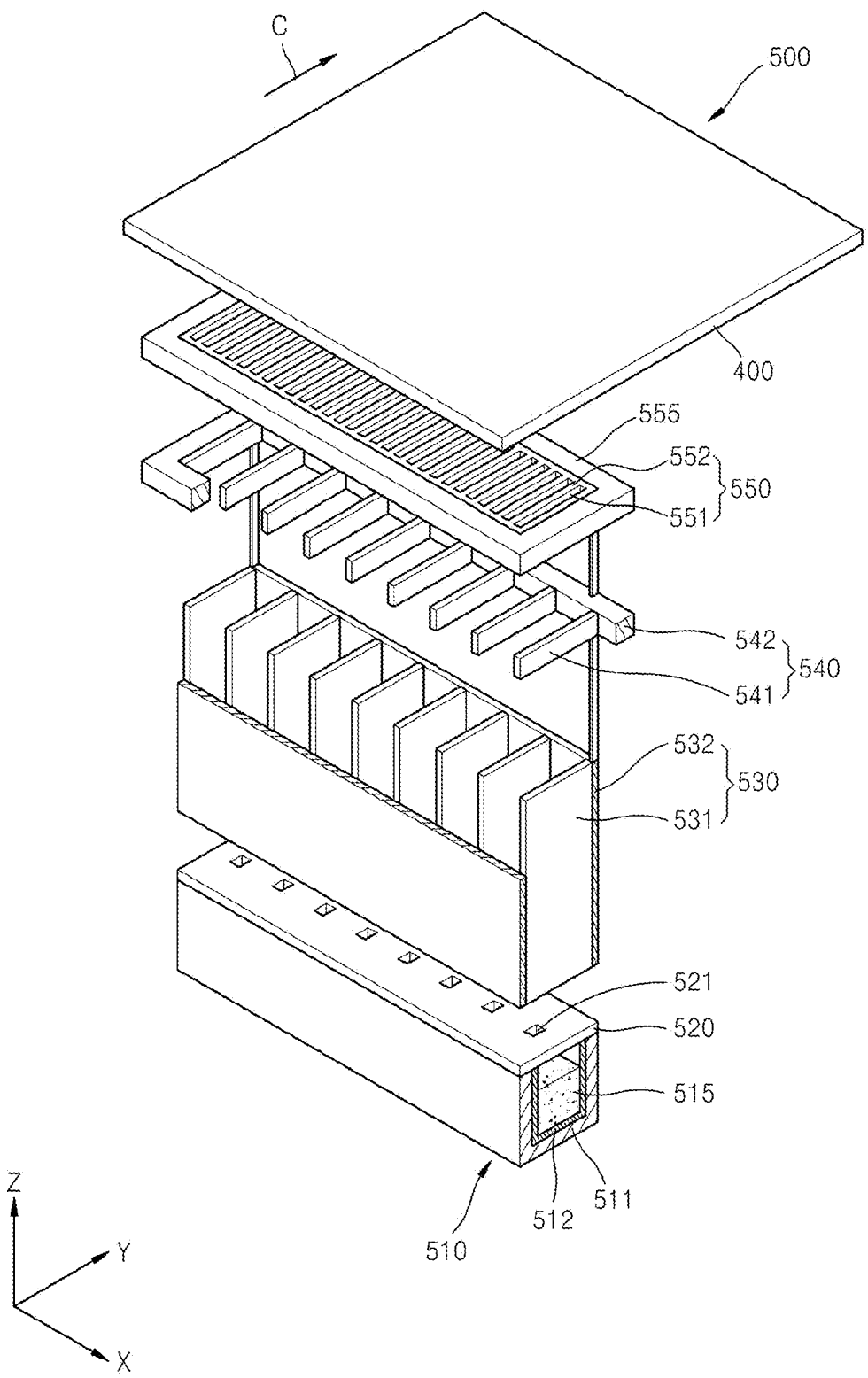
FIG. 8 is a schematic perspective view of a thin film deposition apparatus according to another embodiment of the present invention.

FIG. 8 is a schematic perspective view of a thin film deposition apparatus 500 according to another embodiment of the present invention.

Referring to FIG. 8, the thin film deposition apparatus 500 includes a deposition source 510, a deposition source nozzle unit 520, a first barrier plate assembly 530, a second barrier plate assembly 540, a patterning slit sheet 550, and a substrate 400.

Although a chamber is not illustrated in FIG. 8 for convenience of explanation, all the components of the thin film deposition apparatus 500 may be disposed within a chamber that is maintained at an appropriate degree of vacuum. The chamber is maintained at an appropriate vacuum in order to allow a deposition material to move in a substantially straight line through the thin film deposition apparatus 100.

The substrate 400, which constitutes a target on which a deposition material 515 is to be deposited, is disposed in the chamber. The deposition source 510 that contains and heats the deposition material 515 is disposed in an opposite side of the chamber to that in which the substrate 400 is disposed. The deposition source 510 may include a crucible 511 and a heater 512.

The deposition source nozzle unit 520 is disposed at a side of the deposition source 510, and in particular, at the side of the deposition source 510 facing the substrate 400. The deposition source nozzle unit 520 includes a plurality of deposition source nozzles 521 arranged in the X-axis direction.

The first barrier plate assembly 530 is disposed at a side of the deposition source nozzle unit 520. The first barrier plate assembly 530 includes a plurality of first barrier plates 531, and a first barrier plate frame 532 that covers sides of the first barrier plates 531.

The second barrier plate assembly 540 is disposed at a side of the first barrier plate assembly 530. The second barrier plate assembly 540 includes a plurality of second barrier plates 541, and a second barrier plate frame 542 that covers sides of the second barrier plates 541.

The patterning slit sheet 550 and a patterning slit sheet frame 555 in which the patterning slit sheet 550 is bound are disposed between the deposition source 510 and the substrate 400. The frame 555 may be formed in a lattice shape, similar to a window frame. The patterning slit sheet 550 includes a plurality of patterning slits 551 arranged in the X-axis direction.

The thin film deposition apparatus 500 includes two separate barrier plate assemblies, i.e., the first barrier plate assembly 530 and the second barrier plate assembly 540, unlike the thin film deposition apparatus 100 illustrated in FIG. 3, which includes one barrier plate assembly 130.

The plurality of first barrier plates 531 may be arranged parallel to each other at equal intervals in the X-axis direction. In addition, each of the first barrier plates 531 may be formed to extend along an YZ plane in FIG. 8 i.e., perpendicular to the X-axis direction.

The plurality of second barrier plates 541 may be arranged parallel to each other at equal intervals in the X-axis direction. In addition, each of the second barrier plates 541 may be formed to extend in the YZ plane in FIG. 8, i.e., perpendicular to the X-axis direction.

The plurality of first barrier plates 531 and second barrier plates 541 arranged as described above partition the space between the deposition source nozzle unit 520 and the patterning slit sheet 550. In the thin film deposition apparatus 500, the deposition space is divided by the first barrier plates 531 and the second barrier plates 541 into sub-deposition spaces that respectively correspond to the deposition source nozzles 521 through which the deposition material 515 is discharged.

The second barrier plates 541 may be disposed to correspond respectively to the first barrier plates 531. In other words, the second barrier plates 541 may be respectively disposed to be parallel to and to be on the same plane as the first barrier plates 531. Each pair of the corresponding first and second barrier plates 531 and 541 may be located on the same plane. As described above, since the space between the deposition source nozzle unit 520 and the patterning slit sheet 550, which will be described later, is partitioned by the first barrier plates 531 and the second barrier plates 541, which are disposed parallel to each other, the deposition material 515 discharged through one of the deposition source nozzles 521 is not mixed with the deposition material 515 discharged through the other deposition source nozzles 521, and is deposited on the substrate 400 through the patterning slits 551. In other words, the first barrier plates 531 and the second barrier plates 541 guide the deposition material 515, which is discharged through the deposition source nozzles 521, so as not to flow in the X-axis direction.

Although the first barrier plates 531 and the second barrier plates 541 are respectively illustrated as having the same thickness in the X-axis direction, the present invention is not limited thereto. In other words, the second barrier plates 541, which need to be accurately aligned with the patterning slit sheet 550, may be formed to be relatively thin, whereas the first barrier plates 531, which do not need to be precisely aligned with the patterning slit sheet 550, may be formed to be relatively thick. This makes it easier to manufacture the thin film deposition apparatus 500.

Figure 9:
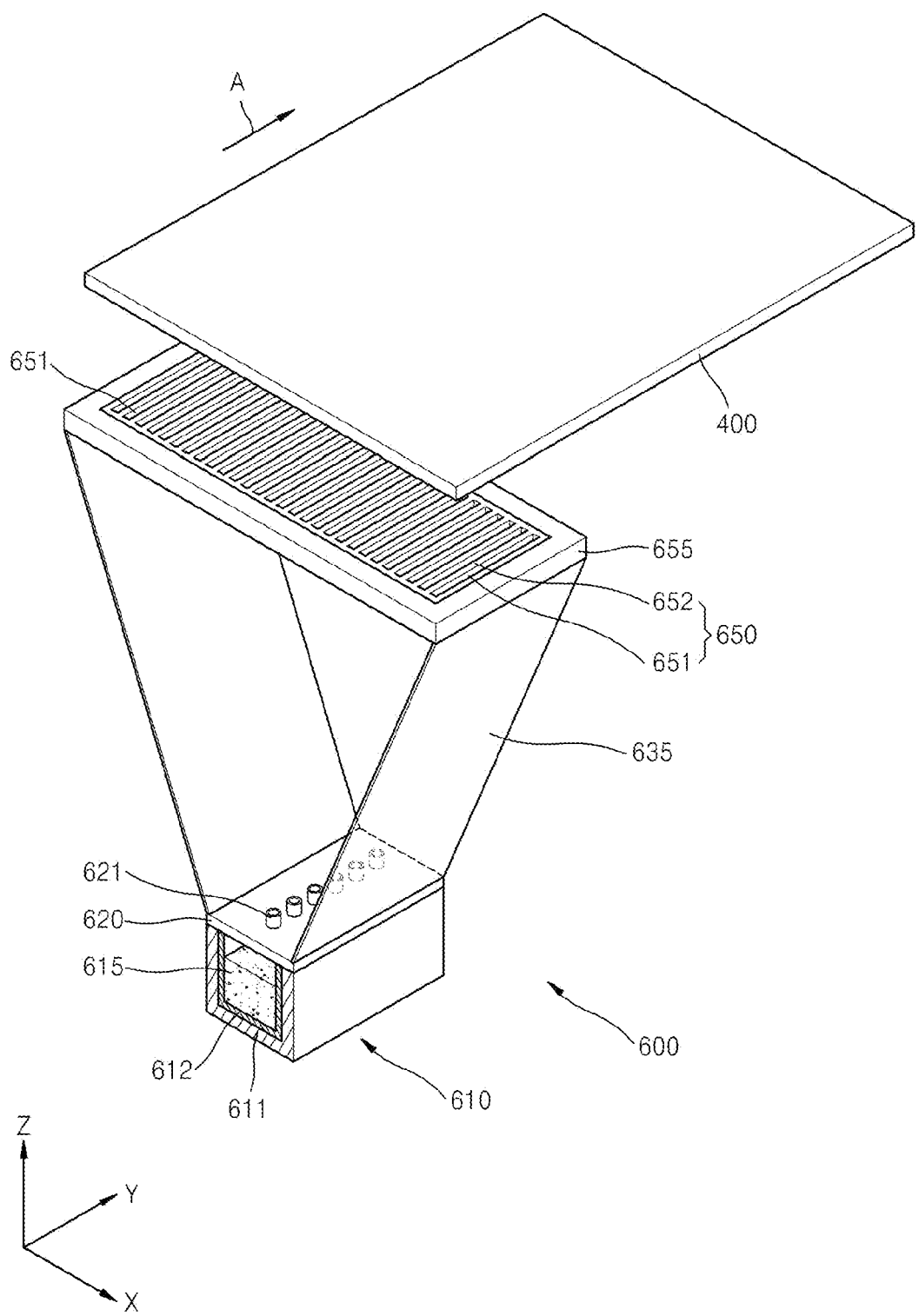
FIG. 9 is a schematic perspective view of a thin film deposition apparatus according to an embodiment of the present invention.
Figure 10:
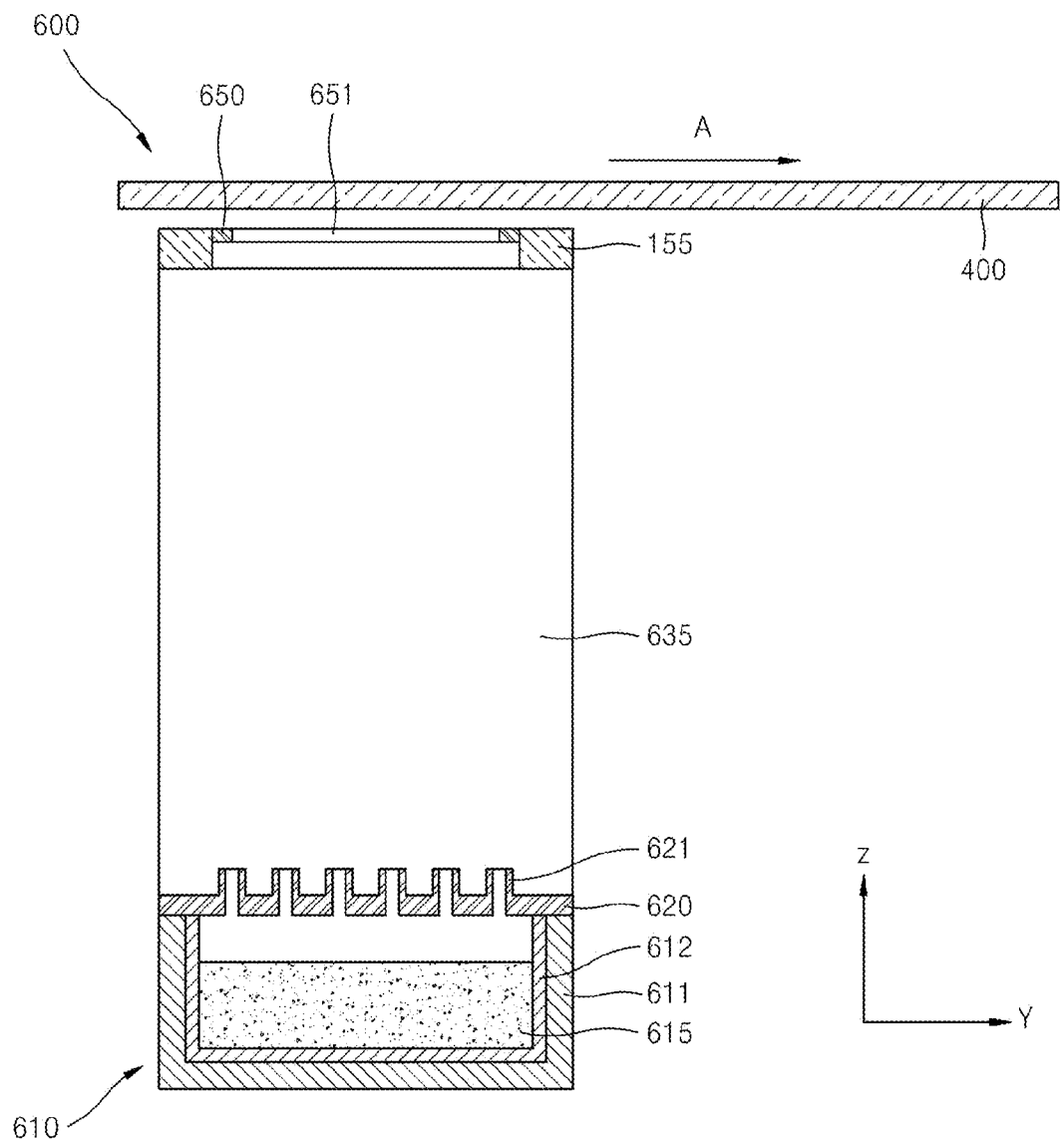
FIG. 10 is a schematic side view of the thin film deposition apparatus of FIG. 9, according to another embodiment of the present invention.
Figure 11:
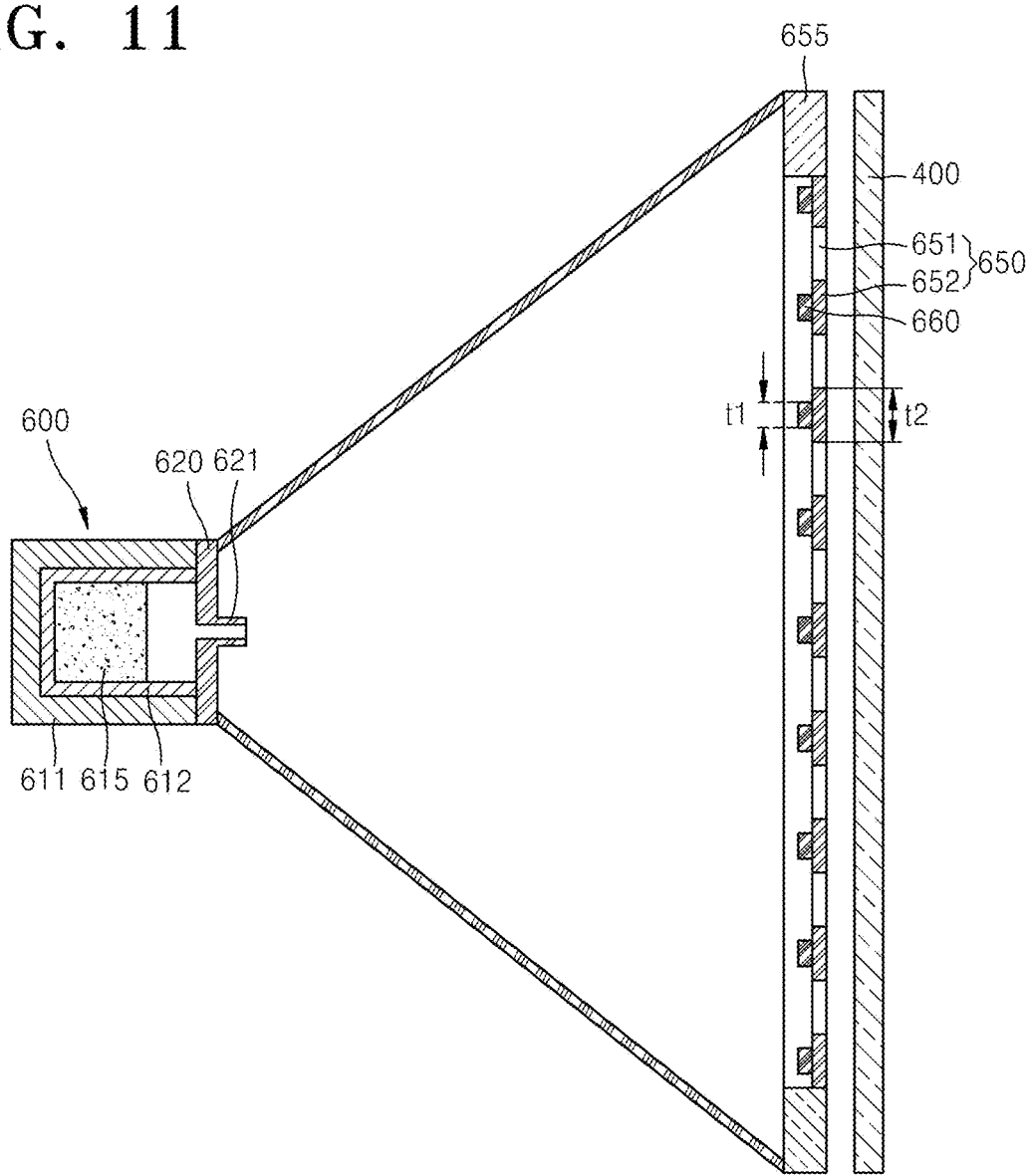
FIG. 11 is a schematic plan view of the thin film deposition apparatus of FIG. 9, according to another embodiment of the present invention.

FIG. 9 is a schematic perspective view of a thin film deposition apparatus 600 according to another embodiment of the present invention, FIG. 10 is a schematic side view of the thin film deposition apparatus 600 of FIG. 9, and FIG. 11 is a schematic plan view of the thin film deposition apparatus 600 of FIG. 9.

Referring to FIGS. 9, 10 and 11, the thin film deposition apparatus 600 includes a deposition source 610, a deposition source nozzle unit 620, and a patterning slit sheet 650.

Although a chamber is not illustrated in FIGS. 9, 10 and 11 for convenience of explanation, all the components of the thin film deposition apparatus 600 may be disposed within a chamber that is maintained at an appropriate degree of vacuum. The chamber is maintained at an appropriate vacuum in order to allow a deposition material to move in a substantially straight line through the thin film deposition apparatus 600.

In particular, in order to deposit a deposition material 615 that is emitted from a deposition source 610 and is discharged through a deposition source nozzle unit 620 and a patterning slit sheet 650, onto a substrate 400 in a desired pattern, it is required to maintain the chamber in a high-vacuum state as in a deposition method using a fine metal mask (FMM). In addition, the temperature of the patterning slit sheet 650 has to be sufficiently lower than the temperature of the deposition source 610. In this regard, the temperature of the patterning slit sheet 150 may be about 100° C. or less. The temperature of the patterning slit sheet 650 should be sufficiently low so as to reduce thermal expansion of the patterning slit sheet 650.

The substrate 400, which constitutes a target on which a deposition material 615 is to be deposited, is disposed in the chamber. The substrate 400 may be a substrate for flat panel displays. A large substrate, such as a mother glass, for manufacturing a plurality of flat panel displays, may be used as the substrate 400. Other substrates may also be employed.

The deposition may be performed while the substrate 400 or the thin film deposition apparatus 600 is moved relative to each other.

In particular, in the conventional FMM deposition method, the size of the FMM has to be equal to the size of a substrate. Thus, the size of the FMM has to be increased as the substrate becomes larger. However, it is neither simple to manufacture a large FMM nor to extend an FMM to be accurately aligned with a pattern.

In order to overcome this problem, in the thin film deposition apparatus 600, deposition may be performed while the thin film deposition apparatus 600 or the substrate 400 is moved relative to each other. In other words, deposition may be continuously performed while the substrate 400, which is disposed such as to face the thin film deposition apparatus 600, is moved in a Y-axis direction. In other words, deposition is performed in a scanning manner while the substrate 400 is moved in a direction of arrow A in FIG. 1. Although the substrate 400 is illustrated as being moved in the Y-axis direction in FIG. 9 when deposition is performed, the present invention is not limited thereto. Deposition may be performed while the thin film deposition apparatus 600 is moved in the Y-axis direction, whereas the substrate 400 is fixed.

Thus, in the thin film deposition apparatus 600 the patterning slit sheet 650 may be significantly smaller than an FMM used in a conventional deposition method. In other words, in the thin film deposition apparatus 600, deposition is continuously performed, i.e., in a scanning manner while the substrate 400 is moved in the Y-axis direction. Thus, lengths of the patterning slit sheet 150 in the X-axis and Y-axis directions may be significantly less than the lengths of the substrate 400 in the X-axis and Y-axis directions. As described above, since the patterning slit sheet 650 may be formed to be significantly smaller than an FMM used in a conventional deposition method, it is relatively easy to manufacture the patterning slit sheet 650. In other words, using the patterning slit sheet 650, which is smaller than an FMM used in a conventional deposition method, is more convenient in all processes, including etching and subsequent processes, such as precise extension, welding, moving, and cleaning processes, when compared to the conventional deposition method using the larger FMM. Therefore, the patterning slit sheet 650 is more advantageous than the FMM when used in the patterning of a relatively large display device.

In order to perform deposition while the thin film deposition apparatus 600 or the substrate 400 is moved relative to each other as described above, the thin film deposition apparatus 600 and the substrate 400 may be separated from each other by a predetermined distance. This will be described later in detail.

The deposition source 610 that contains and heats the deposition material 615 is disposed in an opposite side of the chamber to that in which the substrate 400 is disposed. As the deposition material 615 contained in the deposition source 610 is vaporized, the deposition material 115 is deposited on the substrate 400.

In particular, the deposition source 610 includes a crucible 611 that is filled with the deposition material 615, and a heater 611 that heats the crucible 611 to vaporize the deposition material 615, which is contained in the crucible 611, towards a side of the crucible 111, and in particular, towards the deposition source nozzle unit 620.

The deposition source nozzle unit 620 is disposed at a side of the deposition source 610, and in particular, at the side of the deposition source 610 facing the substrate 400. In addition, the deposition source nozzle unit 620 includes a plurality of deposition source nozzles 621 arranged at equal intervals in the Y-axis direction, that is, in the scanning direction of the substrate 400. The deposition material 615 that is vaporized in the deposition source 610, passes through the deposition source nozzle unit 620 towards the substrate 400 that is a deposition target. As described above, when the plurality of deposition source nozzles 621 are formed on the deposition source nozzle unit 620 in the Y-axis direction, that is, the scanning direction of the substrate 400, a size of the pattern formed by the deposition material that is discharged through each of patterning slits 651 in the patterning slit sheet 650 is only affected by the size of one deposition source nozzle 621, that is, it may be considered that one deposition nozzle 621 exists in the X-axis direction, and thus there is no shadow zone on the substrate 400. In addition, since the plurality of deposition source nozzles 621 are formed in the scanning direction of the substrate 400, even if there is a difference between fluxes of the deposition source nozzles 621, the difference may be compensated and uniformity in the deposition may be maintained constantly.

The patterning slit sheet 650 and a frame 655 in which the patterning slit sheet 650 is bound are disposed between the deposition source 610 and the substrate 400. The frame 655 may be formed in a lattice shape, similar to a window frame. The patterning slit sheet 650 is bound inside the frame 655. In addition, the patterning slit sheet 650 includes a plurality of patterning slits 651 arranged in the X-axis direction. The deposition material 615 that is vaporized in the deposition source 610, passes through the deposition source nozzle unit 620 and the patterning slit sheet 650 towards the substrate 400 that is the deposition target. The patterning slit sheet 650 may be manufactured by etching, which is the same method as used in a conventional method of manufacturing an FMM, and in particular, a striped FMM. Here, the total number of patterning slits 651 may be greater than the total number of deposition source nozzles 621.

In addition, the deposition source 610 (and the deposition source nozzle unit 620 coupled to the deposition source 610) and the patterning slit sheet 650 may be formed to be separated from each other by a predetermined distance. Alternatively, the deposition source 610 (and the deposition source nozzle unit 620 coupled to the deposition source 610) and the patterning slit sheet 650 may be connected by a connection member 635. That is, the deposition source 610, the deposition source nozzle unit 620, and the patterning slit sheet 650 may be formed integrally with each other by being connected to each other via the connection member 635. The connection member 635 guides the deposition material 615, which is discharged through the deposition source nozzles 621, to move straight, not to flow in the X-axis direction. In FIGS. 9 through 11, the connection members 635 are formed on left and right sides of the deposition source 610, the deposition source nozzle unit 620, and the patterning slit sheet 650 to guide the deposition material 615 not to flow in the X-axis direction, however, the present invention is not limited thereto. That is, the connection member 635 may be formed as a sealed type of a box shape to guide flow of the deposition material 615 in both of the X-axis and Y-axis directions.

As described above, the thin film deposition apparatus 600 performs deposition while being moved relative to the substrate 400. In order to move the thin film deposition apparatus 600 relative to the substrate 400, the patterning slit sheet 650 is separated from the substrate 400 by a predetermined distance.

In particular, in a conventional deposition method using an FMM, deposition is performed with the FMM in close contact with a substrate in order to prevent formation of a shadow zone on the substrate. However, when the FMM is used in close contact with the substrate, the contact may cause defects. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

In order to overcome this problem, in the thin film deposition apparatus 600, the patterning slit sheet 650 is disposed to be separated from the substrate 400 which is the deposition target by a predetermined distance.

As described above, a mask is formed to be smaller than a substrate, and deposition is performed while the mask is moved relative to the substrate. Thus, the mask can be easily manufactured. In addition, defects caused due to the contact between a substrate and an FMM, which occurs in the conventional deposition method, may be prevented. In addition, since it is unnecessary to use the FMM in close contact with the substrate during a deposition process, the manufacturing speed may be improved.

Heat dissipation units 660 may be disposed on the patterning slit sheet 650. The heat dissipation units 660 may be disposed on a surface of the patterning slit sheet 650, which faces the deposition source 610. In particular, the patterning slit sheet 650 includes patterning ribs 652 and the patterning slits 651, that is, openings, formed alternately with each other, and the heat dissipation units 660 may be disposed on the patterning ribs 652. A width t1 of each of the heat dissipation units 660 may be equal to or less than a width t2 of each of the patterning ribs 652.

The heat dissipation units 660 heat the patterning slit sheet 650 in order to remove the deposition material deposited on the patterning slit sheet 650. In particular, in the deposition process in the thin film deposition apparatus 600, the deposition material 615 discharged from the deposition source 615 passes through the patterning slits 651 in the patterning slit sheet 650 towards the substrate 400 that is the deposition target, and some of the deposition material 615 may be deposited on the patterning ribs 652 in the patterning slit sheet 650. While stopping the discharge of the deposition material 615 from the deposition source 610 in the deposition process, the heat dissipation units 660 heat the patterning slit sheet 650 to a temperature that is equal to or higher than the vaporization temperature of the deposition material 615 to remove the deposition material 615 deposited on the patterning ribs 652. That is, in the thin film deposition apparatus 600 according to an embodiment of the present embodiment, after stopping the discharge of the deposition material 615 in the deposition process, the patterning slit sheet 650 is heated by the heat dissipation units 660 in the chamber (not shown) to vaporize and remove the deposition material 615 deposited on the patterning ribs 652. After removing the deposition material 614, discharge of the discharge material 615 starts once again in direction of the substrate 400.

Accordingly, in the thin film deposition apparatus 600, the deposition material 615 deposited on the patterning slit sheet 650 may be removed in the chamber, and thus, an additional cleaning process for removing the deposition material 615 on the patterning slit sheet 650 and cleaning the patterning slit sheet 650 is not necessary. Thus, the thin film deposition process may be simplified. In addition, the deposition material 615 deposited on the patterning slit sheet 650 may be removed after stopping the discharge of the deposition material 615 even in the deposition process. Thus, blockage of the patterning slits 651 may be prevented effectively. In addition, the deposition material 615 vaporized by the heat of the heat dissipation units 660 may be deposited on the connection members 635 again, and thus, the deposition material 615 deposited on the connection members 635 may be collected to be reused. Thus, efficiency of utilizing the deposition material 615 may be improved.

The heat dissipation units 660 may maintain the temperature of the patterning slit sheet 650 constant after heating the patterning slit sheet 650. When the patterning slit sheet 650 is maintained at the constant temperature after being heated, a thermal expansion amount of the patterning slit sheet 650 is constantly maintained. In addition, the expanded patterning slit sheet 650 and the substrate 400 are aligned with each other to prevent degradation in uniformity of formed patterns caused by the thermal expansion of the patterning slit sheet 650.

The heat dissipation unit 660 may include a coil heater or a thin film heater.

Figure 12:
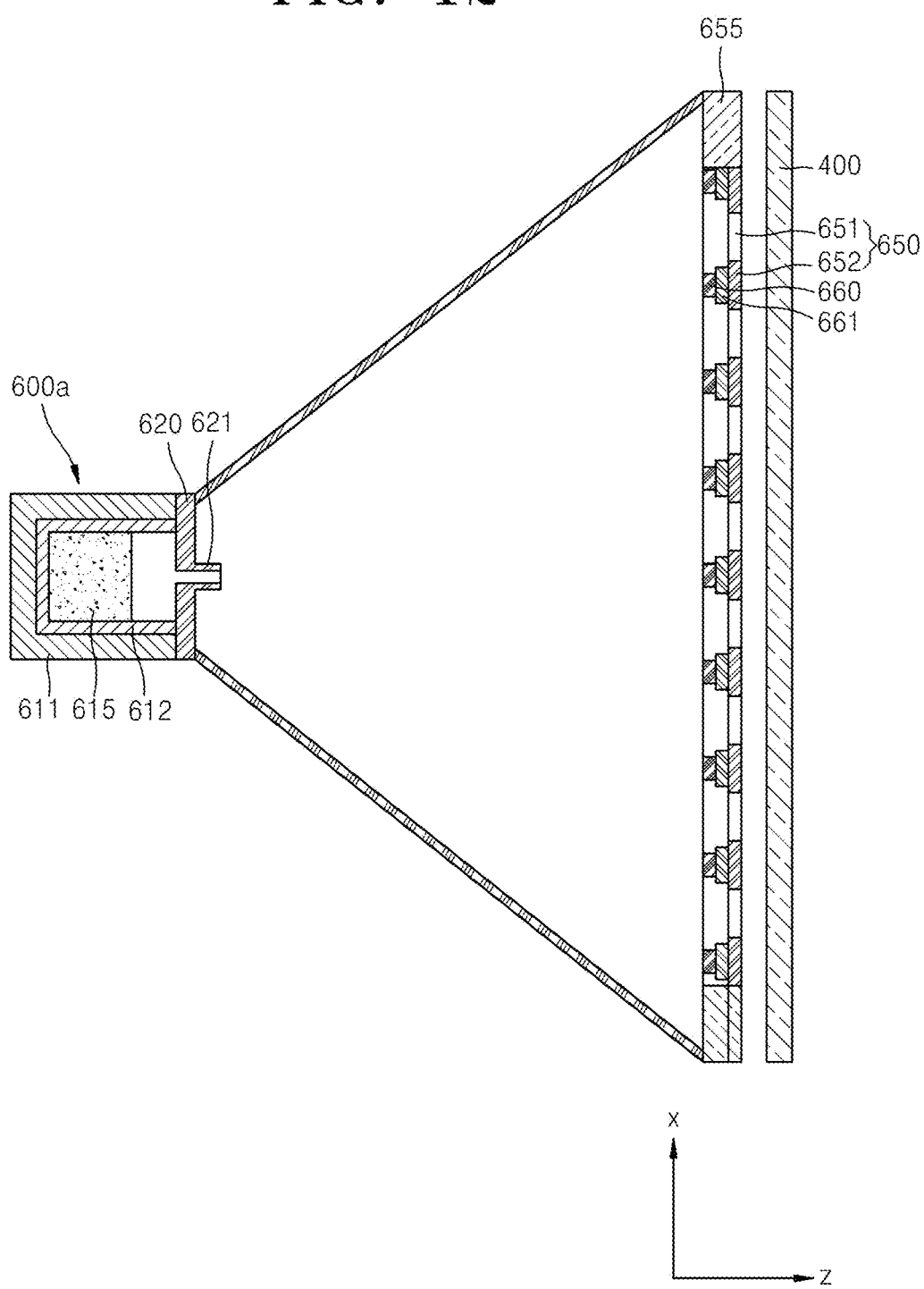
FIG. 12 is a schematic plan view of a thin film deposition apparatus according to another embodiment of the present invention.

FIG. 12 is a schematic plan view of a thin film deposition apparatus 600a according to another embodiment of the present invention.

Referring to FIG. 12, the thin film deposition apparatus 600a of FIG. 12 is different from the thin film deposition apparatus 600 of FIG. 11 in view of further including insulating members 661. The insulating members 661 may be disposed between the heat dissipation unit 650 and the patterning slit sheet 650.

Figure 13:
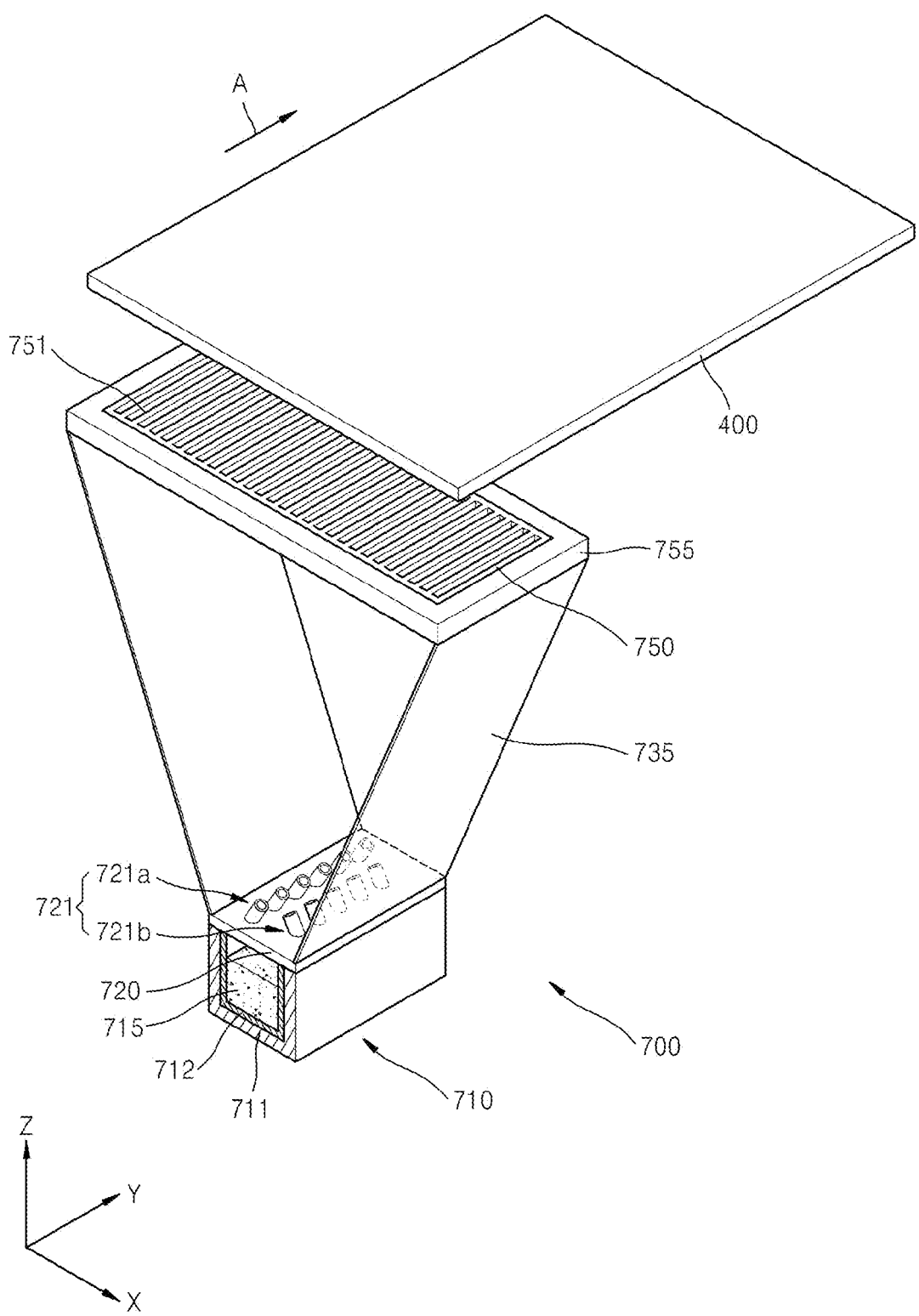
FIG. 13 is a schematic perspective view of a thin film deposition apparatus according to another embodiment of the present invention.

FIG. 13 is a schematic perspective view of a thin film deposition apparatus 700 according to another embodiment of the present invention. Referring to FIG. 13, the thin film deposition apparatus 700 includes a deposition source 710, a deposition source nozzle unit 720, and a patterning slit sheet 750. In particular, the deposition source 710 includes a crucible 711 that is filled with the deposition material 715, and a heater 712 that heats the crucible 711 to vaporize the deposition material 715, which is contained in the crucible 711, towards a side of the crucible 711, and in particular, towards the deposition source nozzle unit 720. The deposition source nozzle unit 720, which has a planar shape, is disposed at a side of the deposition source 710. The deposition source nozzle unit 720 includes a plurality of deposition source nozzles 721 arranged in the Y-axis direction. The patterning slit sheet 750 and a frame 755 are further disposed between the deposition source 710 and the substrate 400, and the patterning slit sheet 750 includes a plurality of patterning slits 751 arranged in the X-axis direction. In addition, the deposition source 710, the deposition source nozzle unit 720, and the patterning slit sheet 750 are connected to each other by the connection member 735.

In the thin film deposition apparatus 700, the plurality of deposition source nozzles 721 formed on the deposition source nozzle unit 720 are tilted at a predetermined angle, unlike the thin film deposition apparatus 600 of FIG. 9. In particular, the deposition source nozzles 721 may include deposition source nozzles 721a and 721b which are arranged in two rows that are alternately arranged with each other. Here, the deposition source nozzles 721a and 721b may be tilted at a predetermined angle on an X-Z plane.

The deposition source nozzles 721a in a first row may be tilted toward the deposition nozzles 721b in a second row, and the deposition source nozzles 721b in the second row may be tilted toward the deposition source nozzles 721a in the first row. That is, the deposition source nozzles 721a arranged in the first row located at the left side of the patterning slit sheet 750 are arranged to face a right side of the patterning slit sheet 750, and the deposition source nozzles 721b arranged in the second row located at the right side of the patterning slit sheet 750 are arranged to face the left side of the patterning slit sheet 750.

Figure 14:
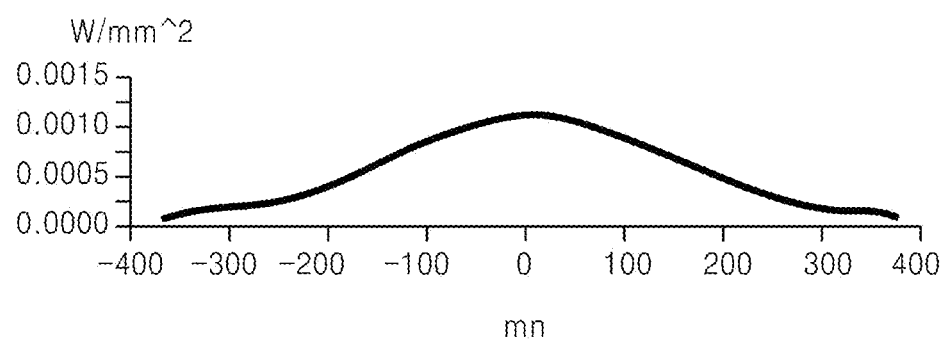
FIG. 14 is a graph schematically illustrating a distribution pattern of a thin film formed on a substrate when deposition source nozzles are not tilted, in a thin film deposition apparatus according to an embodiment of the present invention.
Figure 15:
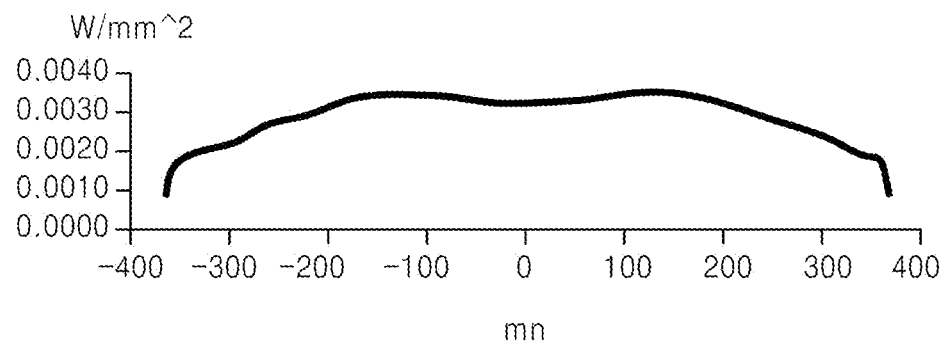
FIG. 15 is a graph schematically illustrating a distribution pattern of a thin film formed on a substrate when deposition source nozzles are tilted, in a thin film deposition apparatus according to an embodiment of the present invention.

FIG. 14 is a graph showing a distribution of the thin film formed on the substrate when the deposition source nozzles 721 are not tilted, in the thin film deposition apparatus 700, and FIG. 15 is a graph showing a distribution of the thin film formed on the substrate 400 when the deposition source nozzles 721 are tilted, in the thin film deposition apparatus 700. Comparing the graphs of FIGS. 14 and 15 with each other, thickness of both sides of the thin film formed on the substrate 400 when the deposition source nozzles 721 are tilted is relatively greater than that of both sides of the thin film formed on the substrate 400, when the deposition source nozzles 721 are not tilted, and thus, the uniformity of the deposition layer is improved.

Therefore, the deposition amount of the deposition material 715 may be adjusted so that a difference between the thicknesses of a center portion of the thin film and sides of the thin film formed on the substrate 400 may be reduced and the entire thickness of the thin film may be constant, and moreover, the efficiency of utilizing the deposition material 715 may be improved.

As described above, the thin film deposition apparatus according to aspects of the present invention may be easily manufactured and may be simply applied to produce large-sized display devices on a mass scale. The thin film deposition apparatus may improve manufacturing yield and deposition efficiency and may allow deposition materials to be reused.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an organic light-emitting display device by using a thin film deposition apparatus for forming a thin film on a substrate, the thin film deposition apparatus including a deposition source nozzle unit including a plurality of deposition source nozzles, a patterning slit sheet including a plurality of patterning slits and patterning ribs, and a plurality of heat dissipation units on the patterning slit sheet, each of the patterning ribs disposed between neighboring patterning slits of the plurality of patterning slits, the plurality of heat dissipation units disposed on a surface of the patterning ribs facing the deposition source nozzle unit, the method comprising:

arranging the substrate to be separated from the thin film deposition apparatus by a predetermined distance at a first side of the patterning slit sheet, the deposition source nozzle unit being at a second side of the patterning slit sheet opposite the first side, the predetermined distance being smaller than a distance from the deposition source nozzle unit to the second side of the patterning slit sheet; and depositing a deposition material discharged from the deposition source nozzle unit via the plurality of patterning slits between the patterning ribs on which the plurality of heat dissipation units are disposed while at least one of the thin film deposition apparatus or the substrate is moved relative to the other one of the thin film deposition apparatus or the substrate.

2. The method of claim 1, wherein the depositing of the deposition material on the substrate comprises continuously depositing the deposition material on the substrate while the at least one of the thin film deposition apparatus or the substrate is moved relative to the other one of the thin film deposition apparatus or the substrate.

3. The method of claim 1, further comprising heating the patterning slit sheet using the heat dissipation units.

4. The method of claim 3, wherein heating the patterning slit sheet comprises removing the deposition material deposited on the patterning slit sheet.

5. The method of claim 4, wherein heating the patterning slit sheet comprises heating the patterning slit sheet to a temperature at which the deposition material is vaporized, or to a higher temperature.

6. A method of manufacturing an organic light-emitting display device by using a thin film deposition apparatus for forming a thin film on a substrate, the thin film deposition apparatus including a deposition source nozzle unit including a plurality of deposition source nozzles a patterning slit sheet including a plurality of patterning slits, and a plurality of heat dissipation units on the patterning slit sheet, the method comprising:

arranging the substrate to be separated from the thin film deposition apparatus by a predetermined distance at a first side of the patterning slit sheet, the deposition source nozzle unit being at a second side of the patterning slit sheet opposite the first side;

depositing a deposition material discharged from the thin film deposition apparatus onto the substrate while at least one of the thin film deposition apparatus or the substrate is moved relative to the other one of the thin film deposition apparatus or the substrate; and heating the patterning slit sheet using the plurality of heat dissipation units, wherein heating the patterning slit sheet comprises heating the patterning slit sheet while the thin film deposition apparatus stops discharging the deposition material.

7. The method of claim 3, further comprising maintaining a temperature of the patterning slit sheet constant after heating the patterning slit sheet.

8. The method of claim 1, wherein the heat dissipation units comprise a coil heater.

9. The method of claim 1, wherein the heat dissipation units comprise a thin film heater.

10. The method of claim 1, wherein the thin film deposition apparatus further includes a heat insulating member between the heat dissipation units and the patterning slit sheet.

11. The method of claim 1, wherein the patterning slit sheet is smaller than the substrate in at least one of a first direction or a second direction perpendicular to the first direction.

* * * * *

UNITED STATES PATENT AND TRADEMARK OFFICE
CERTIFICATE OF CORRECTION

PATENT NO. : 8,486,737 B2
APPLICATION NO. : 12/856942
DATED : July 16, 2013
INVENTOR(S) : Yun-Mi Lee et al.

It is certified that error appears in the above-identified patent and that said Letters Patent is hereby corrected as shown below:

In the Claims

| | |
|---|---|
| Column 20, Claim 1, line 25 | Delete "pattering" <br> Insert -- patterning -- |
| Column 20, Claim 6, line 64 | Delete "nozzles" <br> Insert -- nozzles, -- |

Signed and Sealed this
Second Day of December, 2014

Michelle K. Lee
*Deputy Director of the United States Patent and Trademark Office*